United States Patent [19]
Beauvillier et al.

[11] Patent Number: 6,104,291
[45] Date of Patent: Aug. 15, 2000

[54] METHOD AND APPARATUS FOR TESTING RFID TAGS

[75] Inventors: Luc Beauvillier, Richardson, Tex.; Michael John Brady, Brewster, N.Y.; Dah-Weih Duan, Yorktown Heights, N.Y.; Daniel J. Friedman, Tarrytown, N.Y.; Paul Andrew Moskowitz, Yorktown Heights, N.Y.; Philip Murphy, New Fairfield, Conn.

[73] Assignee: Intermec IP Corp., Woodland Hills, Calif.

[21] Appl. No.: 09/167,026

[22] Filed: Oct. 6, 1998

Related U.S. Application Data
[60] Provisional application No. 60/070,938, Jan. 9, 1998.

[51] Int. Cl.⁷ .................................................. G08B 21/00
[52] U.S. Cl. ..................................... 340/572.1; 340/572.5
[58] Field of Search ............................. 340/572.1, 572.5

[56] References Cited

U.S. PATENT DOCUMENTS

| | | | |
|---|---|---|---|
| 4,075,632 | 2/1978 | Baldwin et al. | 342/51 |
| 4,360,810 | 11/1982 | Landt | 342/44 |
| 4,782,345 | 11/1988 | Landt | 206/222 |
| 4,786,907 | 11/1988 | Koelle | 342/51 |
| 4,835,377 | 5/1989 | Brown | 235/492 |
| 4,853,705 | 8/1989 | Landt | 343/803 |
| 4,864,158 | 9/1989 | Koelle et al. | 327/31 |
| 4,888,591 | 12/1989 | Landt et al. | 342/44 |
| 4,999,636 | 3/1991 | Landt et al. | 342/90 |
| 5,030,807 | 7/1991 | Landt et al. | 235/375 |
| 5,055,659 | 10/1991 | Hendrick et al. | 235/439 |
| 5,479,160 | 12/1995 | Koelle | 340/825.7 |
| 5,485,520 | 1/1996 | Chaum et al. | 380/24 |
| 5,504,485 | 4/1996 | Landt et al. | 342/42 |
| 5,510,795 | 4/1996 | Koelle | 342/114 |
| 5,521,601 | 5/1996 | Kandlur et al. | 342/44 |
| 5,528,222 | 6/1996 | Moskowitz et al. | 340/572.7 |
| 5,538,803 | 7/1996 | Gambino et al. | 428/694 TM |
| 5,550,547 | 8/1996 | Chan et al. | 342/42 |
| 5,552,778 | 9/1996 | Schrott et al. | 340/825.34 |
| 5,554,974 | 9/1996 | Brady et al. | 340/572.6 |
| 5,563,583 | 10/1996 | Brady et al. | 340/572.2 |
| 5,565,847 | 10/1996 | Gambino et al. | 340/572.6 |
| 5,606,323 | 2/1997 | Heinrich et al. | 342/51 |
| 5,635,693 | 6/1997 | Benson et al. | 235/384 |
| 5,673,037 | 9/1997 | Cesar et al. | 340/825.54 |
| 5,680,106 | 10/1997 | Schrott et al. | 340/572.5 |
| 5,682,143 | 10/1997 | Brady et al. | 340/572.7 |
| 5,729,201 | 3/1998 | Jahnes et al. | 340/572.1 |
| 5,729,697 | 3/1998 | Schkolnick et al. | 705/23 |
| 5,736,929 | 4/1998 | Schrott et al. | 340/572.1 |
| 5,737,710 | 4/1998 | Anthonyson | 701/1 |
| 5,739,754 | 4/1998 | Schrott et al. | 340/572.2 |
| 5,767,789 | 6/1998 | Afzali-Ardakani et al. | 340/825.54 |
| 5,771,021 | 6/1998 | Veghte et al. | 343/700 MS |
| 5,777,561 | 7/1998 | Chieu et al. | 16/218 |
| 5,786,626 | 7/1998 | Brady et al. | 257/673 |
| 5,812,065 | 9/1998 | Schrott et al. | 340/825.54 |
| 5,821,859 | 10/1998 | Schrott et al. | 340/572.6 |

(List continued on next page.)

FOREIGN PATENT DOCUMENTS

| | | |
|---|---|---|
| 0 294 963 | 12/1988 | European Pat. Off. . |
| 0 646 983 | 4/1995 | European Pat. Off. . |
| WO 98/16070 | 4/1998 | WIPO . |

OTHER PUBLICATIONS

"Multifunction Credit Card Package" IBM Technical Disclosure Bulletin, vol. 38, No. 08, Aug. 1995, p. 17.

"A Low–Power CMOS Integrated Circuit for Field–Powered Radio Frequency Identification Tag" By Friedman et al., 1997 IEEE International Solid State Circuits Conference, Paper SA 17.5, pp. 294, 295, 474.

*Primary Examiner*—Glen Swann
*Attorney, Agent, or Firm*—O'Melveny & Myers LLP

[57] ABSTRACT

The present invention provides a method and apparatus for testing RFID tags using wireless radio frequency (RF) communication. The method and apparatus allow RFID tags to be tested individually or in groups while they are in close proximity to each other (e.g., within the read range of the tag).

58 Claims, 15 Drawing Sheets

U.S. PATENT DOCUMENTS

| | | | |
|---|---|---|---|
| 5,825,329 | 10/1998 | Veghte et al. | 343/700 MS |
| 5,826,328 | 10/1998 | Brady et al. | 29/827 |
| 5,828,318 | 10/1998 | Cesar | 340/825.69 |
| 5,828,693 | 10/1998 | Mays et al. | 375/202 |
| 5,831,532 | 11/1998 | Gambino et al. | 340/572.1 |
| 5,850,181 | 12/1998 | Heinrich et al. | 340/572.1 |
| 5,850,187 | 12/1998 | Carrender et al. | 340/825.54 |
| 5,874,902 | 2/1999 | Heinrich et al. | 340/825.54 |

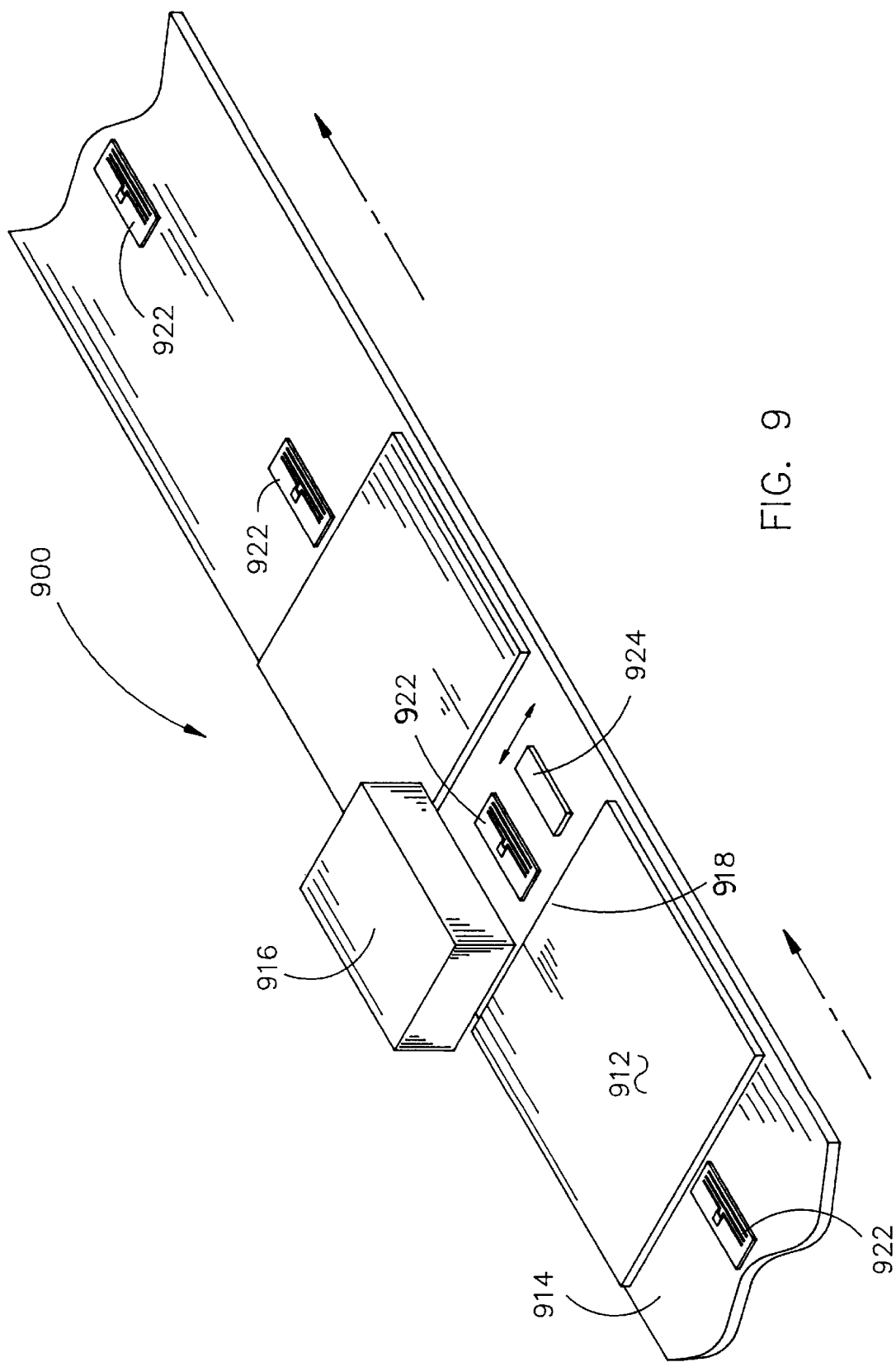

METHOD AND APPARATUS FOR TESTING RFID TAGS

CROSS-REFERENCE TO RELATED APPLICATIONS

The present application claims the benefit under 35 U.S.C. § 119 of U.S. Provisional Application No. 60/070,938, filed on Jan. 9, 1998. Said U.S. Provisional Application No. 60/070,938 is herein incorporated by reference in its entirety.

FIELD OF THE INVENTION

The present invention relates generally to radio frequency identification (RFID) systems, and more specifically to a method and apparatus for testing RFID tags or transponders used in RFID systems.

BACKGROUND OF THE INVENTION

Radio Frequency Identification (RFID) is becoming an important identification technology in applications such as inventory management, security access, personnel identification, factory automation, automotive toll debiting, and vehicle identification to name just a few. RFID systems utilize an RFID transmitter-receiver unit (usually referred to as a base station or interrogator) to query an RFID transponder or tag which maybe located at a distance from the transmitter-receiver unit. The RFID tag detects the interrogating signal and transmits a response signal containing encoded data back to the receiver.

RFID systems provide identification functions not found in identification technologies such as optical indicia (e.g., bar code) recognition systems. For example, RFID systems may employ RFID tags containing read/write memory of several kilobytes or more. The RFID tags may be readable at a distance and do not require direct line-of-sight view by the reading apparatus (e.g., base station or interrogator). Further, several such RFID tags may be read by the RFID system at one time.

To improve the reliability of RFID tags and to prevent the distribution of RFID tags which do not function properly due to a manufacturing defect, it is desirable to test or screen each RFID tag (or a representative number thereof) during assembly. Tests may be performed on RFID tag components (i.e., wafer sorting, board screening, etc.) to verify operation of the components before they are assembled into the RFID tag. Fully assembled RFID tags may also be tested to verify their operation (e.g., a "field test"). Such field tests allow fully assembled RFID tags to be tested within an RF field rather than probed on a test bench. Thus, field testing has many advantages over component screening alone. For example, circuits whose operation can only be verified in the RF field may be tested. Further, RFID tags typically function only when all components (the RFID circuits, the antenna, the battery, the packaging, etc.) are correctly assembled. Field testing, unlike component screening, allows verification of correct assembly.

Field testing of assembled RFID tags may be accomplished using a base station having a normal read range. The base station generates an RF interrogation field which activates and interrogates the RFID tag to determine if it is functioning properly. At present, only the RFID tag which is being tested is placed within the read range of the base station during the test so that RFID tags which are not being tested are not activated. Inadvertent activation of other RFID tags could cause them to provide return signals which would be received by the base station. These return signals would interfere with the return signal produced by the RFID tag being tested resulting in incorrect test results and, in the case of a read/write tag, undesirable information being written to the tag.

Consequently, it is necessary to physically separate RFID tags during testing by a distance at least as great as the read range of the RFID system. As methods for assembling RFID tags are automated (i.e., via assembly line processes), the time needed to produce a typical RFID tag is decreased to the point where testing of the RFID tags may significantly slow production. Thus, it would be advantageous to provide a method and apparatus for testing RFID tags wherein multiple tags may be sequentially tested while in close proximity to each other (e.g., within the normal read range of the RFID system).

SUMMARY OF THE INVENTION

Accordingly, the present invention is directed to a novel method and apparatus for testing (and/or writing information to) RFID tags using wireless radio frequency (RF) communication.

The method includes the steps of generating a radio frequency field for testing the RFID tags; sequentially positioning each RFID tag within the radio frequency field while substantially isolating the remaining RFID tags from the field; communicating with each RFID tag while it is positioned within the radio frequency field; and removing each RFID tag from the radio frequency field whereupon it may be sorted based on its functional performance.

The apparatus includes a test assembly which generates a radio frequency field for communicating with RFID tags when the RFID tags are positioned within the radio frequency field. A carriage assembly sequentially positions RFID tags within the radio frequency field generated by the test assembly so that they may be individually tested by the testing apparatus. The carriage assembly may then remove the RFID tags from the radio frequency field whereupon they may be sorted by a sorting device based on their functional performance.

An RF shield may shield the RFID tags from the radio frequency field until they are positioned therein by the carriage assembly for testing. The RF shield may be a miniaturized anechoic chamber, a plate of RF absorbing material, a resonant cavity, or may be a metal object which modifies the input impedance of the RFID tag's antenna to change its impedance matching factor thereby, in effect, disabling the RFID tag. Alternatively, instead of a shield, the test assembly may generate a low power RF field (having a range significantly less that the read range of the RFID system) so that the volume of the generated RF field is substantially the same as the volume of the RFID tag being tested. The testing apparatus of the present invention may individually test a single RFID tag or may test multiple tags simultaneously.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 9 is an isometric view of an apparatus according to a fifth exemplary embodiment of the present invention wherein the impedance matching factor of the RFID tag is modified by changing the input impedance of the antenna of the RFID tag.

DETAILED DESCRIPTION OF THE INVENTION

The present invention provides a method and apparatus for testing RFID tags using wireless radio frequency (RF) communication. The method and apparatus allow RFID tags to be individually tested while they are in close proximity to each other (e.g., within the read range of the RFID system). Thus, the present invention is particularly applicable in RFID tag assembly or manufacturing environments where it is desirable to test or screen RFID tags for manufacturing defects and/or write information to the tag's memory. Such tests typically test completed RFID tags (e.g., are a "field" test)

RFID tags which may be tested using the present method and apparatus may be either "active" or "passive." Active RFID tags includes an internal transmitter or transceiver for transmitting a return signal to the testing apparatus, interrogator, or base station, while passive tags provide the return signal via a modulated back scattered RF field. Additionally, RFID tags may be field powered, or at least partially battery powered. Field powered RFID tags collect power from the RF field generated by the testing apparatus (or alternatively, an interrogator or base station) and convert the collected power to a dc voltage which is stored in a capacitor to provide power for operating the tag's other circuitry. Battery powered RFID tags typically employ a high-capacity battery mounted to the tag.

Reference will now be made in detail to the presently preferred embodiments of the invention, examples of which are illustrated in the accompanying drawings.

Figure 1:
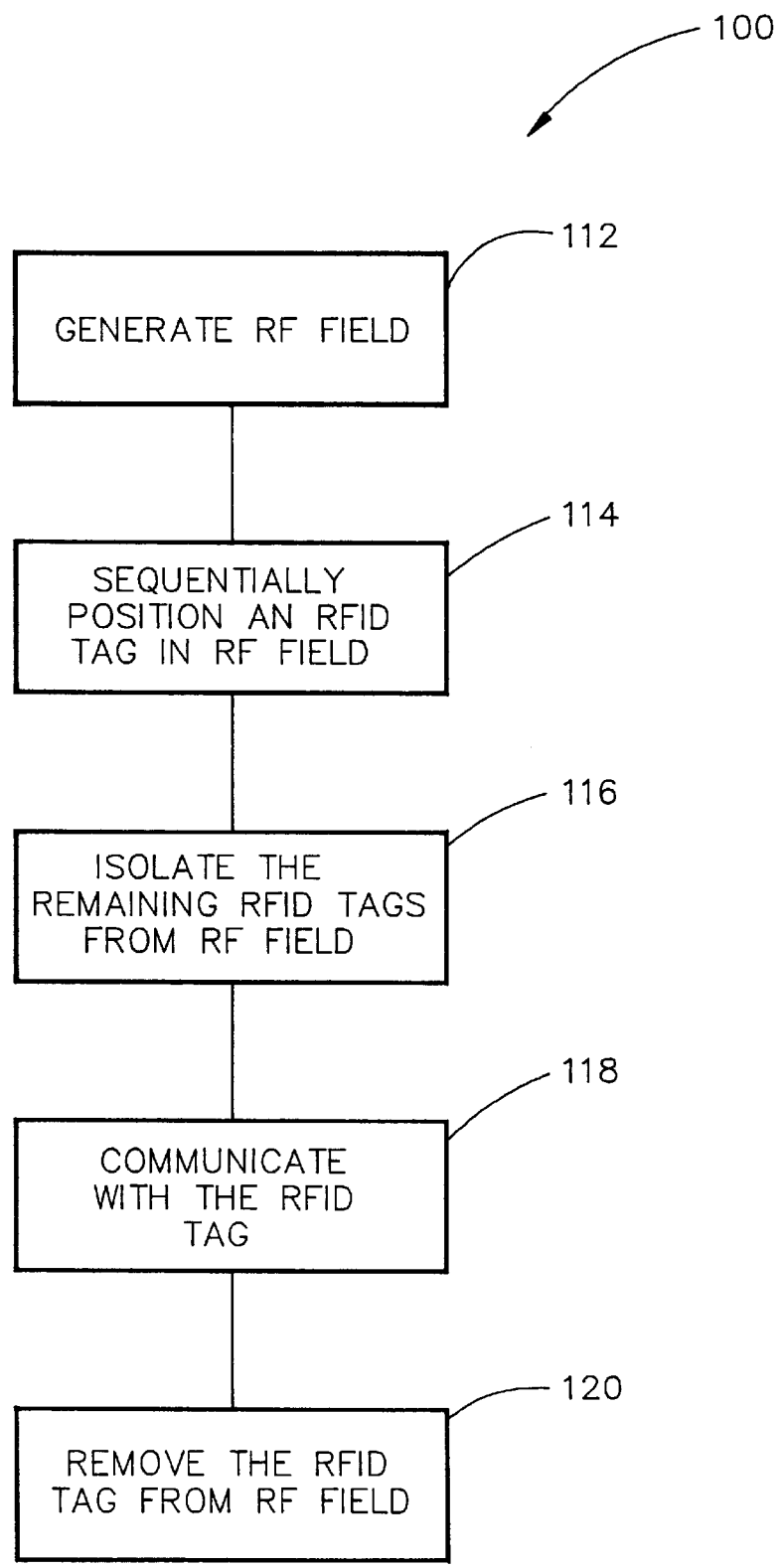
FIG. 1 is a flow diagram illustrating a method for testing RFID tags in accordance with the present invention.

Referring now to FIG. 1, an exemplary method for testing RFID tags using wireless RF communication is illustrated. The method 100 provides rapid individual testing of RFID tags to detect manufacturing defects and the like during production (i.e., on an assembly line) or immediately thereafter. The method 100 also facilitates rapid programming or writing of information to the RFID tags while they are tested.

As shown in FIG. 1, a radio frequency (RF) interrogation field is generated for testing the RFID tags at step 112. The field may be generated by a test assembly, interrogator, or base station comprising an RF transceiver (transmitter and receiver) and antenna or resonant cavity and probe. Preferably, the test assembly modulates the interrogation field so that it may activate (e.g., power and initiate communication with) the RFID tag which is being tested.

RFID tags may be sequentially positioned within (i.e., carried into, dropped through, etc.) the RF interrogation field at step 114 so that they may be individually tested. Preferably, all remaining RFID tags which are not being tested are substantially isolated from the field at step 116 so that they are not activated.

Each RFID tag may be transported within a test chamber by a carriage assembly. The test chamber may be a miniaturized anechoic chamber lined with RF absorbing material. In this manner, an anechoic environment is created which simulates free space. Alternatively, the test chamber may be metallic box (or cylinder, sphere, etc.) forming a resonant cavity sized to have a resonant frequency which is the same as the RFID system's carrier frequency. The resonant cavity is excited by the probe (i.e., a hook or pin) which couples RF power in the transmission line (e.g., coaxial cable) from the RF transceiver to the field in the cavity.

In an alternative embodiment, each RFID tag may be shielded during transport by the carriage assembly. The RF shield may comprise a plate made of an RF absorbing material. An aperture is formed within the plate adjacent to the test assembly. As each RFID tag is carried past the aperture by the carriage assembly, it is exposed to the RF interrogation field so that it may be tested. The RF shield may alternatively comprise a plate (or other object) made of metal. The metal plate modifies the input impedance of the RFID tag's antenna to change its impedance matching factor. In this fashion, the metal plate functions as a loading element to the antenna of each shielded RFID tag disabling the tag by deteriorating its impedance matching factor. The RFID tags are thus "isolated" from the RF field because they cannot be activated by it.

In yet another embodiment, the volume of the RF interrogation field generated by the test assembly may be substantially the same as the volume of the RFID tag. The RFID tag being tested may be positioned within this field by the carriage assembly. RFID tags may thus be placed in close proximity to the RFID tag being tested while remaining unexposed and thus unaffected by the RF field.

Communication is established, if possible, with the RFID tag while it is positioned within the RF field at step 118 so functions of the RFID tag may be tested. Information such as programming, identification information, and the like may also be written to the tag. A computer based controller may compare the performance of each tested RFID tag (as determined by the testing apparatus) with predetermined performance tolerances to determine if the RFID tag is functioning properly. If the RFID tag fails to provide a proper return signal in response to its exposure to the RF interrogation field, the controller identifies the RFID tag as non-functioning.

Upon completion of testing, each RFID tag is removed from the RF field (i.e., the test assembly may be turned off and/or the RFID tag may be removed from the chamber or aperture) at step 120. The RFID tag may then be sorted based on its functional performance. Preferably, non-functioning or improperly functioning RFID tags are separated from properly functioning tags. The non-functioning or improperly functioning tags may then be repaired, discarded, destroyed or subjected to further testing to discover the cause of their failure to function. Similarly, RFID tags may be sorted according to the information which was written to them by the test assembly.

Figure 2:
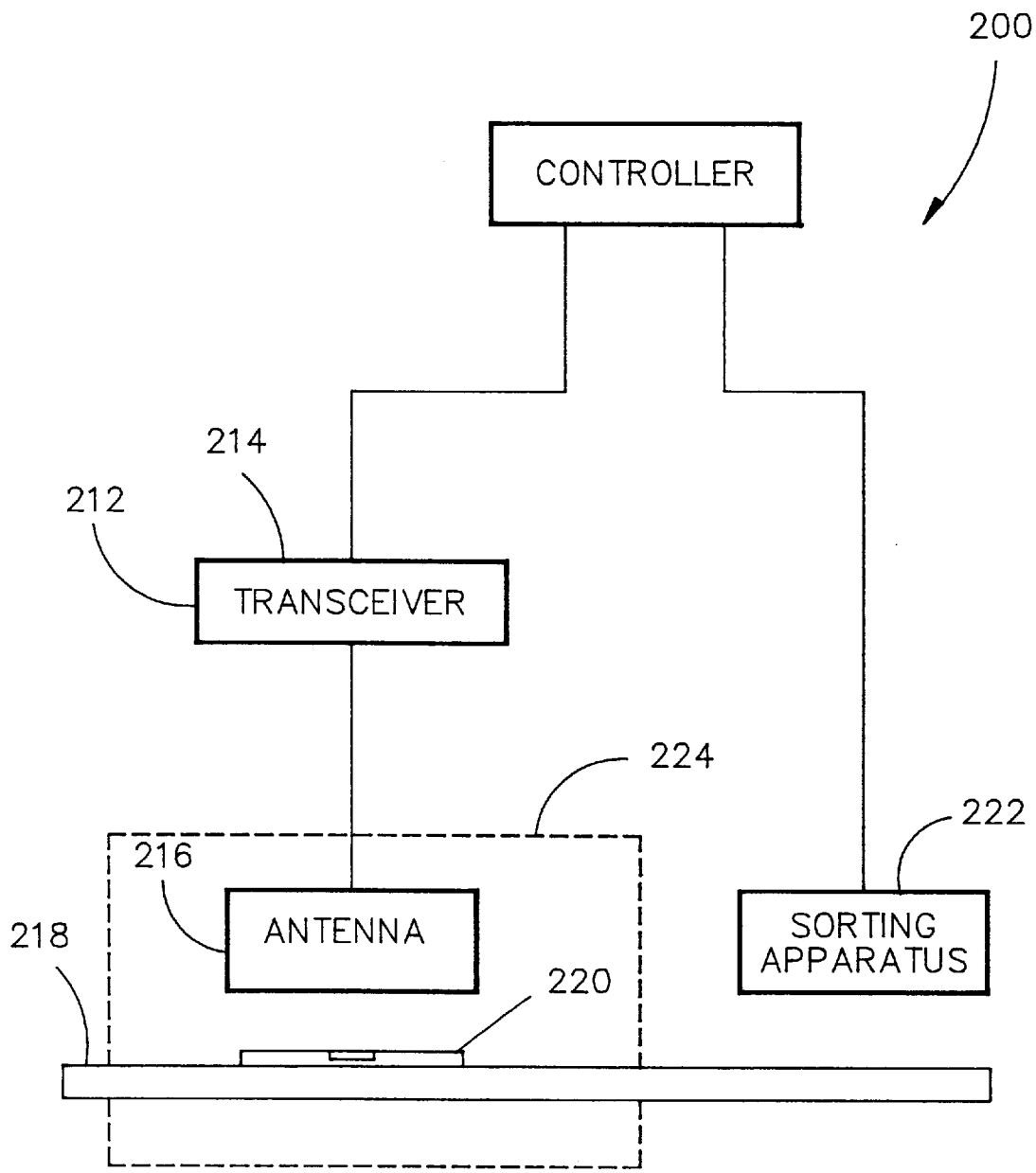
FIG. 2 is a block diagram depicting an apparatus for testing RFID tags in accordance with present invention.

Referring now to FIG. 2, a block diagram generally illustrating a testing apparatus for testing RFID tags in accordance with the method depicted in FIG. 1 is shown. The testing apparatus 200 preferably includes a test assembly (i.e., an interrogator or base station) 212 which comprises an RF transceiver 214 and antenna (or, alternatively, a resonant cavity and probe) 216, and a carriage assembly 218. The test assembly 212 is preferably capable of generating a radio frequency (RF) interrogation field for communicating with an RFID tag 220. The carriage assembly 218 sequentially positions RFID tags within the RF interrogation field so that they may be individually tested by the test assembly 212. After testing is complete, the carriage assembly 218 may remove the RFID tag 220 from the RF interrogation field, whereupon the tag may be sorted by sorting apparatus 222 based on its functional performance. Preferably, the carriage assembly 218 carries the RFID tags into and out of the RF interrogation field. Alternatively, the carriage assembly 218 may be arranged to transport the RFID tags through the field in some other fashion such as dropping the tags through the field. An RF shield 224 may shield RFID tags 220 from the RF interrogation field until they are positioned therein by the carriage assembly 218 for testing. Alternatively, instead of a shield 224, a low power RF field may be used. Preferably, the volume of the low power RF field (e.g., the volume in which the low-power RF field is strong enough to power the RFID tag) is substantially the same as the volume of the RFID tag 220 being tested. Thus, the remaining tags (tags which are in transit to be tested or have already been tested) are not affected by the RF interrogation field. A controller, processor, computer, or the like 222 may integrate operation of the test assembly 212 and the carriage assembly 218. In this manner, the testing apparatus 200 may facilitate rapid testing of RFID tags in an automated production or assembly line environment.

Referring now to FIGS. 3A through 3D, an exemplary embodiment of the testing apparatus shown in FIG. 2 is illustrated. The testing apparatus 300 includes an RF shield 312 comprising a box shaped (or, alternatively, cylindrical, spherical, oval, etc) test chamber 318, a test assembly 316, and a carriage assembly 322. Preferably, the RF shield 312 provides a means for isolating RFID tags in transit to be tested or which have already been tested from the RF interrogation field generated by the test assembly 316. Thus, only the RFID tag which is contained within the RF shield 312 (e.g., the test chamber 318) is exposed to the RF interrogation field.

Figure 3A:
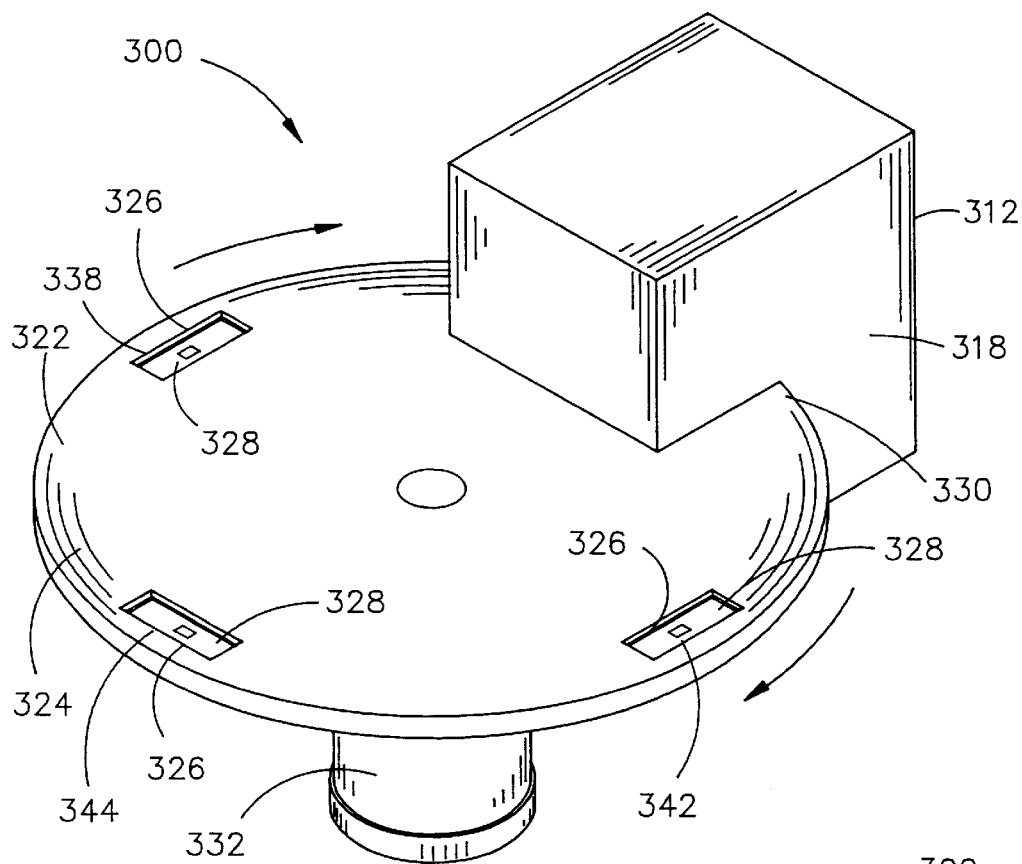
FIG. 3A is an isometric view of an apparatus for testing RFID tags in accordance with a first exemplary embodiment of the present invention wherein the testing apparatus includes a rotatable stage for positioning RFID tags within a testing chamber.

As shown in FIG. 3A, the carriage assembly 322 sequentially positions RFID tags within the test chamber 318 where they are exposed to the RF interrogation field generated by a test assembly 316. The carriage assembly 322 comprises a generally circular rotatable stage or turntable 324 having one or more shallow recesses arrayed in its upper surface forming holders 326 for removably receiving RFID tags 328. The stage 324 partially extends into the Test chamber 318 via a slot 330 in the chamber 318 so that only one of the holders 326, and the RFID tag 328 contained therein, is enclosed within the chamber 318 for testing.

The carriage assembly 322 may comprise a drive system 332 for rotating the stage 324. Preferably, the drive system 332 includes a transmission which indexes the stage 324 to sequentially position each holder 326, and the RFID tag 328 contained therein, within the test chamber 318. Indexing of the stage 324 is accomplished by causing the drive system 344 to periodically rotate the stage 324 through a predetermined arc so that each holder 326 rotated within the Test chamber 318 for a period of time and then removed.

Figure 3B:
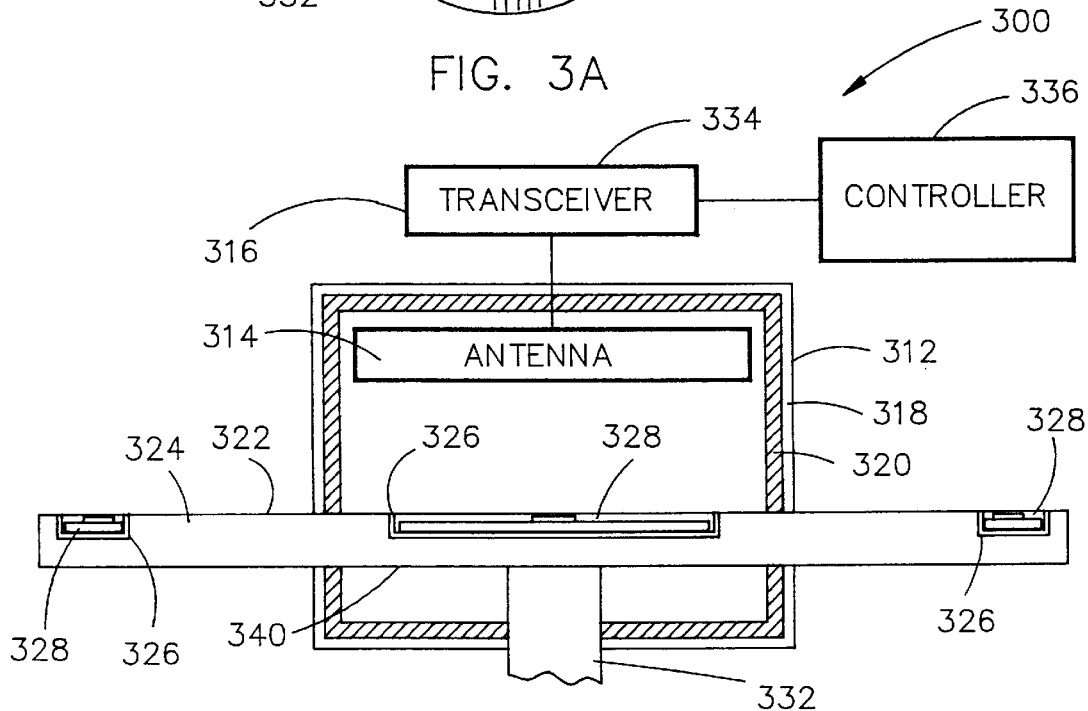
FIG. 3B is a diagrammatic cross-sectional side elevational view of the apparatus shown in FIG. 3A, wherein the testing chamber comprises a miniaturized anechoic chamber.

As shown in FIG. 3B, the test chamber 318 may be a miniaturized anechoic chamber formed of or lined with RF absorbing material 320. Preferably, the RF absorbing material 320 creates an anechoic environment which simulates a free space. The RF absorbing material 320 may also sufficiently reduce RF emissions from the chamber 318 so that any RF field outside of the chamber 318 has insufficient intensity to activate an RFID tag. The test assembly 316 includes an RF antenna 314 and transceiver 334 which generates an RF field within the chamber 318.

Figure 3C:
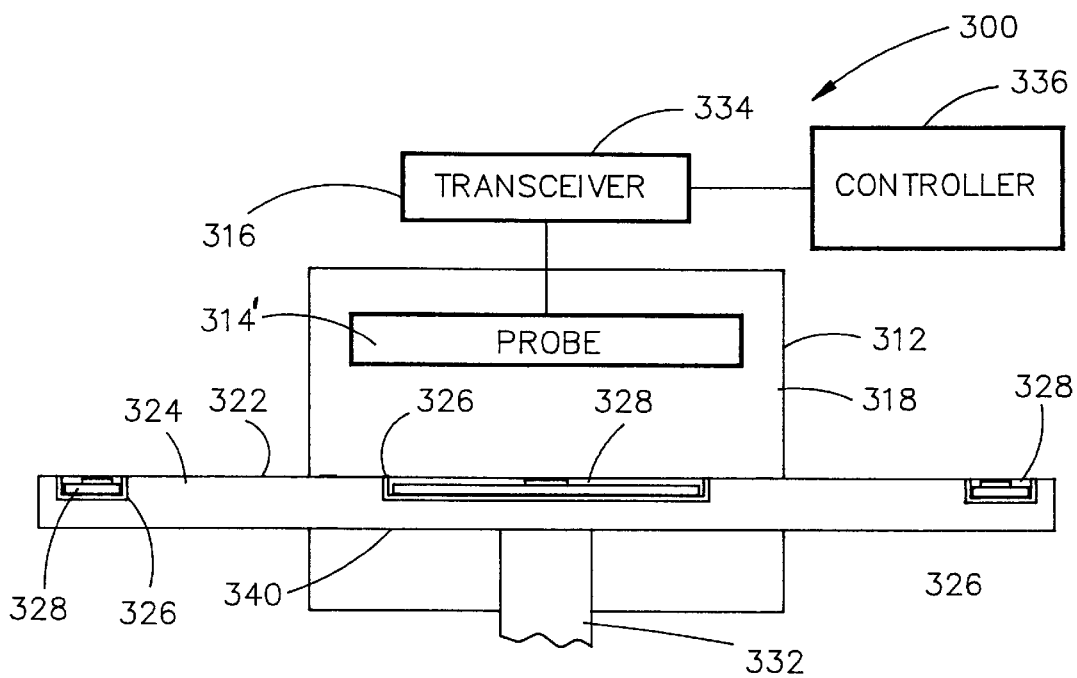
FIG. 3C is a diagrammatic cross-sectional side elevational view of the apparatus shown in FIG. 3A, wherein the testing chamber comprises a resonant cavity.

Alternatively, as shown in FIG. 3C, the chamber 318 may be metallic box (or cylinder, sphere, etc.) forming a resonant cavity sized to have a resonant frequency which is the same as the RFID system's carrier frequency. The resonant cavity is excited by a probe (i.e., a hook or pin) 314' which couples the RF power in the transmission line (i.e., a coaxial cable) from the transceiver 334 to the field in the resonant cavity. See, R. E. Collin, *Foundations for Microwave Engineering*, 2nd Ed., McGraw Hill, 1992, which is herein incorporated by reference in its entirety.

Referring now to FIGS. 3B and 3C, the transceiver 334 may be coupled to a controller 336. The controller 336 controls and integrates operation of the carriage assembly 322 and test assembly 316. Preferably, when an RFID tag 328 is moved within the Test chamber 318 by the carriage assembly 322, the controller 336 activates the transceiver 334 which generates and modulates the RF field. The RF field activates (e.g., powers and/or communicates with) the RFID tag 328 so that the various commands and functions of the RFID tag 328 may be tested and information such as programming, identification information, and the like may be written to the tag 328. Preferably, the controller 336 compares the performance of RFID tag 328 with predetermined performance tolerances stored in its memory to determine if the RFID tag 328 is functioning properly. The controller 336 may also record the test results for later analysis.

An exemplary stage 318, as shown in FIG. 3A, may have four holders 326 arranged at ninety (90) degree intervals about its perimeter. A first of the holders 326 may be positioned at a first or "loading" position 338 by the drive system 332 so that a single assembled, untested RFID tag 328 may be loaded into the holder 326. The controller 336 may then cause the drive system 332 to index the stage 324 so that the first holder 326, containing the RFID tag 328, is rotated ninety (90) degrees and positioned within the test chamber 318. Preferably, the test chamber 318 and test assembly 316 comprise the second or "testing" position 340. The controller 336 may then initiate the test assembly 316 to generate an RF interrogation field within the Test chamber 318. Preferably, the RF interrogation field activates and tests the RFID tag 328 and writes any necessary information to the tag's memory. Indexing of the stage 324 also moves a second of the holders 326 into the loading position 338 so that an assembled, untested RFID tag 326 may be loaded into the holder 326.

After testing and/or writing of the RFID tag 328 in the first holder 326 and loading of an RFID tag 328 into the second holder 326 is accomplished, the controller 336 may again cause the drive system 332 to index the stage 324 ninety (90) degrees. The first holder 326, and the now tested RFID tag 328 contained therein, is moved to a third or "unloading" position 340 where the RFID tag 328 may be unloaded from the holder 326 if desired. The second holder 326, and the RFID tag 328 contained therein, is moved into the test chamber 318 where the RFID tag 326 may be tested. Indexing of the stage 324 also moves a third of the holders 326 into the loading position 338 so that an assembled, untested RFID tag 328 may be loaded into the third holder 326.

The controller 336 may again cause the drive system 332 to index the stage 324 ninety (90) degrees so that the first holder 326 is moved to a fourth or "final" position 344. If the RFID tag 328 contained within the first holder 326 was not previously unloaded at the third ("unloading") position 342, it is unloaded from the holder 326. The second holder 326, and the now tested RFID tag 328 contained therein, is moved to the third ("unloading") position 342. Indexing of the stage 324 also moves the third holder 326, and the RFID tag 328 contained therein, into the Test chamber 318 to be tested, and moves the fourth of the holders 326 into the loading position 338 so that an assembled, untested RFID tag 326 may be loaded into the holder 326. The controller 336 may then cause the drive system 332 to index the stage 324 so that the first holder 326, now empty, is again moved to the first ("loading") position 338 to receive another assembled, untested RFID tag 328.

Preferably, RFID tags 328 are loaded into and unloaded from the holders 326 using conventional automated equipment or machinery such as a conveyer system, robotic arm, or the like (not shown). Alternatively, each RFID tag 328 may be placed in and/or removed from the holders 326 by hand. Further, the third ("unloading") position 342 and the fourth ("final") position 344 may be used as a means to sort the tested RFID tags 328 based on their functional performance. For example, the controller 336 may cause a non-functioning or improperly functioning RFID tag 326 to be unloaded from the stage 324 at the third ("unloading") position 342 while the remaining properly functioning tags 328 are unloaded from the stage 324 at the fourth ("final") position 344. The non-functioning or improperly functioning RFID tags 328 may then be repaired, discarded, destroyed or subjected to further testing to discover the cause of its failure to properly function.

The stage 324 may be continuously indexed so that each of the four holders 326 are repeatedly positioned at the "loading" 338, "testing" 340, "unloading" 342, and "final" 344 positions. In this manner, the RFID tag testing apparatus 300 may be used in a manufacturing or assembly environment to provide rapid testing of RFID tags 328 after they are assembled.

Figure 3D:
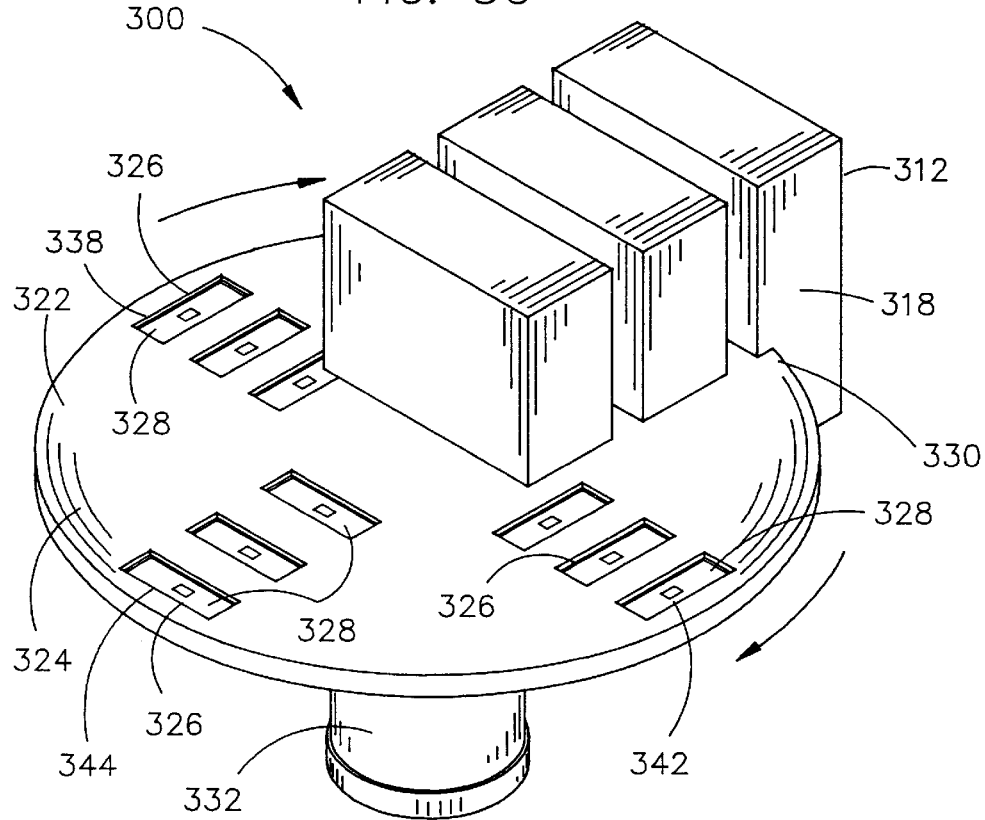
FIG. 3D is an isometric view of an apparatus for testing RFID tags in accordance with the first exemplary embodiment of the present invention wherein the testing apparatus includes a rotatable stage for simultaneously positioning multiple RFID tags within multiple testing chambers.

As shown in FIG. 3D, the testing apparatus 300 may be expanded to include multiple chambers 318 (three are shown) so that multiple RFID tags 326 may be tested simultaneously. The carriage assembly 322 may include a corresponding number of holders 326 (e.g., four rows of three holders 326 each arranged at ninety (90) degree intervals about the stage 324) so that an RFID tag 328 may be positioned within each chamber 318. In this manner, testing throughput may be increased without use of multiple test assemblies.

Referring now to FIGS. 4A through 4D, an apparatus for testing RFID tags in accordance with a second exemplary embodiment of the present invention is illustrated. As shown, the RFID tag testing apparatus 400 also includes an RF shield 412 comprising a box shaped (or, alternatively, cylindrical, spherical, oval, etc) test chamber 418, a test assembly 414, and a carriage assembly 422.

The carriage assembly 422 sequentially positions RFID tags to be tested within the test chamber 418 where they may be exposed the RF interrogation field. The carriage assembly 422 preferably comprises a conveyor system (i.e., a conveyor belt, a slide, rollers, etc.) 424 having one or more shallow recesses linearly arrayed in its upper surface to form holders 426 for removably receiving RFID tags 428. The conveyor 424 may pass through the test chamber 418 via a slot 426 in the wall of the chamber 418 so that only one of the holders 426, and the RFID tag 428 contained therein, is enclosed within the chamber 418 during testing. Preferably, the conveyor system 424 moves at a constant rate so that each RFID tag 428 moves through the test chamber 418 for a period of time sufficient for the test assembly 414 to functionally test the tags 428, and to write any required information to the tag's memory. Alternatively, the conveyor system 424 may be indexed (e.g., alternately moved and stopped) so that each RFID tag 428 is transported into the test chamber 418 and held there momentarily while it is tested by the test assembly 414.

Figure 4A:
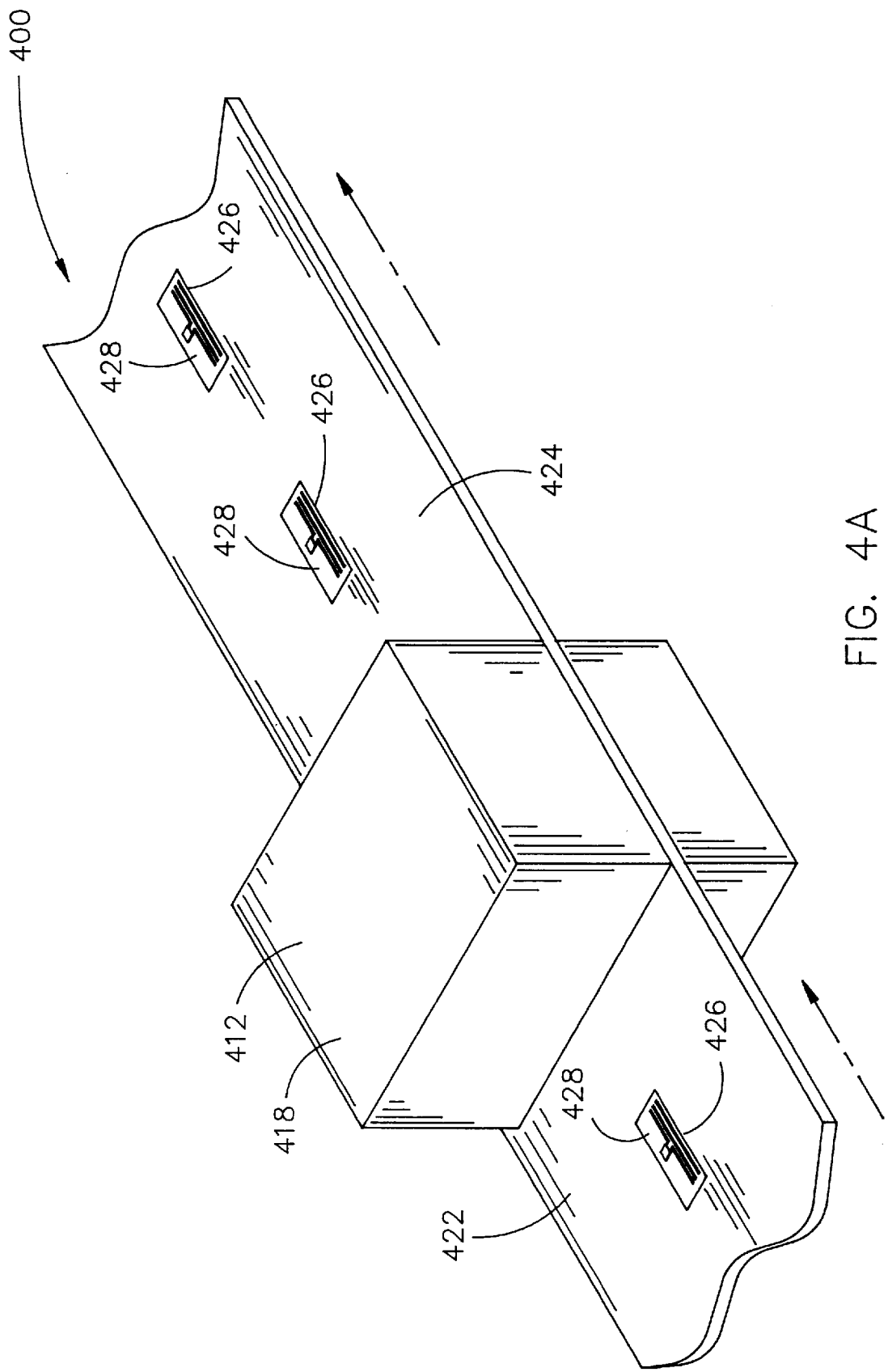
FIG. 4A is an isometric view of an apparatus for testing RFID tags in accordance with a second exemplary embodiment of the present invention wherein the testing apparatus includes a conveyor for positioning RFID tags within a test chamber.
Figure 4B:
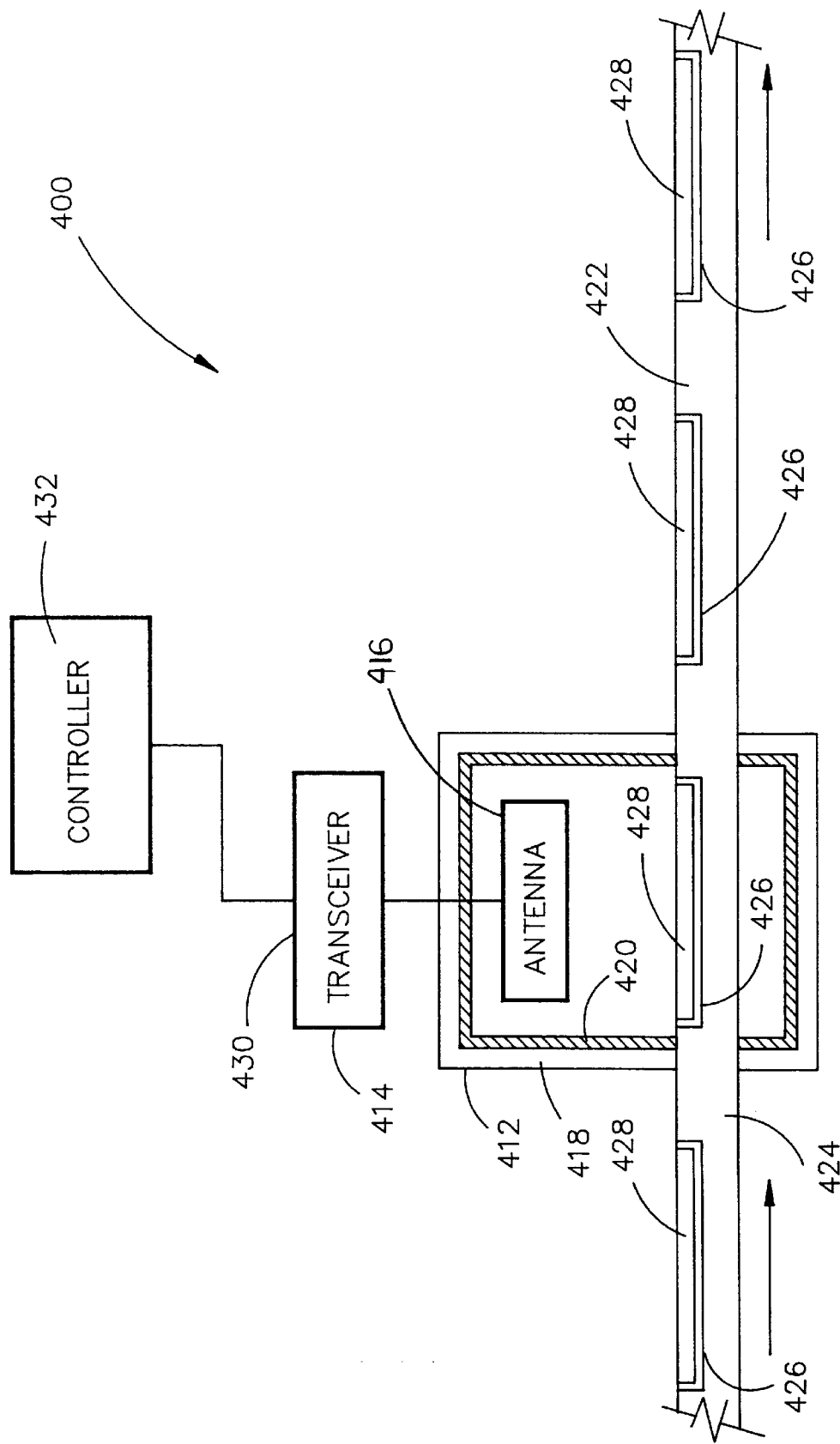
FIG. 4B is a diagrammatic cross-sectional side elevational view of the apparatus shown in FIG. 4A wherein the test chamber comprises a miniaturized anechoic chamber.

As shown in FIG. 4B, the test chamber 418 may be an miniaturized anechoic chamber formed of or lined with RF absorbing material 420 which creates an anechoic environment simulating a free space. The RF absorbing material 420 may also sufficiently reduce RF emissions from the test chamber 418 so that any RF field outside of the chamber 418 has insufficient intensity to activate an RFID tag. The test assembly 414 includes an RF antenna 416, and transceiver 430 which generates an RF field within the test chamber 418.

Figure 4C:
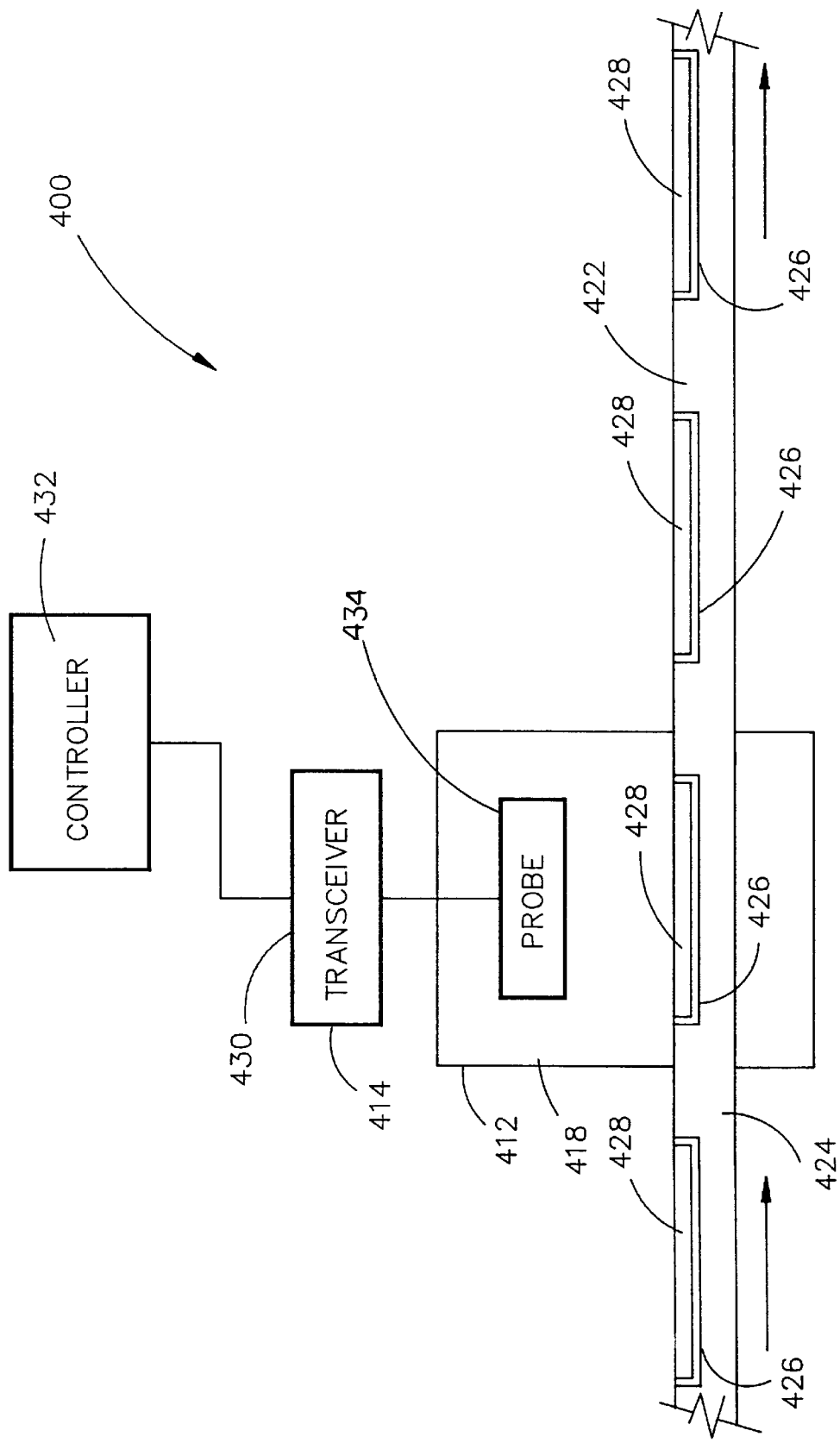
FIG. 4C is a diagrammatic cross-sectional side elevational view of the apparatus shown in FIG. 4A, wherein the testing chamber comprises a resonant cavity.

Alternatively, as shown in FIG. 4C, the test chamber 418 may be metallic box (or cylinder, sphere, etc.) forming a resonant cavity sized to have a resonant frequency which is the same as the RFID system's carrier frequency. The resonant cavity is excited by a probe (i.e., a hook or pin) 434 which couples the RF power in the transmission line (e.g., coaxial cable) from the transceiver 430 to the field in the resonant cavity. See, R. E. Collin, *Foundations for Microwave Engineering*, 2nd Ed., McGraw Hill, 1992.

Referring now to FIGS. 4B and 4C, the transceiver 430 may be coupled to a controller 432. The controller 432 may control and integrate operation of the carriage assembly 422 and test assembly 414. Preferably, when an RFID tag 428 is moved within the test chamber 418 by the carriage assembly 422, the controller 432 activates the transceiver 430 which generates and modulates the RF interrogation field. The RF interrogation field activates (e.g., powers and/or communicates with) the RFID tag 428 so that the various commands and functions of the RFID tag 428 may be tested and information such as programming, identification information, and the like may also be written to the tag 428. The controller 432 compares the performance of RFID tag 428 with predetermined performance tolerances to determine if the RFID tag 428 is functioning properly. The controller 432 may also record the test results for later analysis.

Figure 4D:
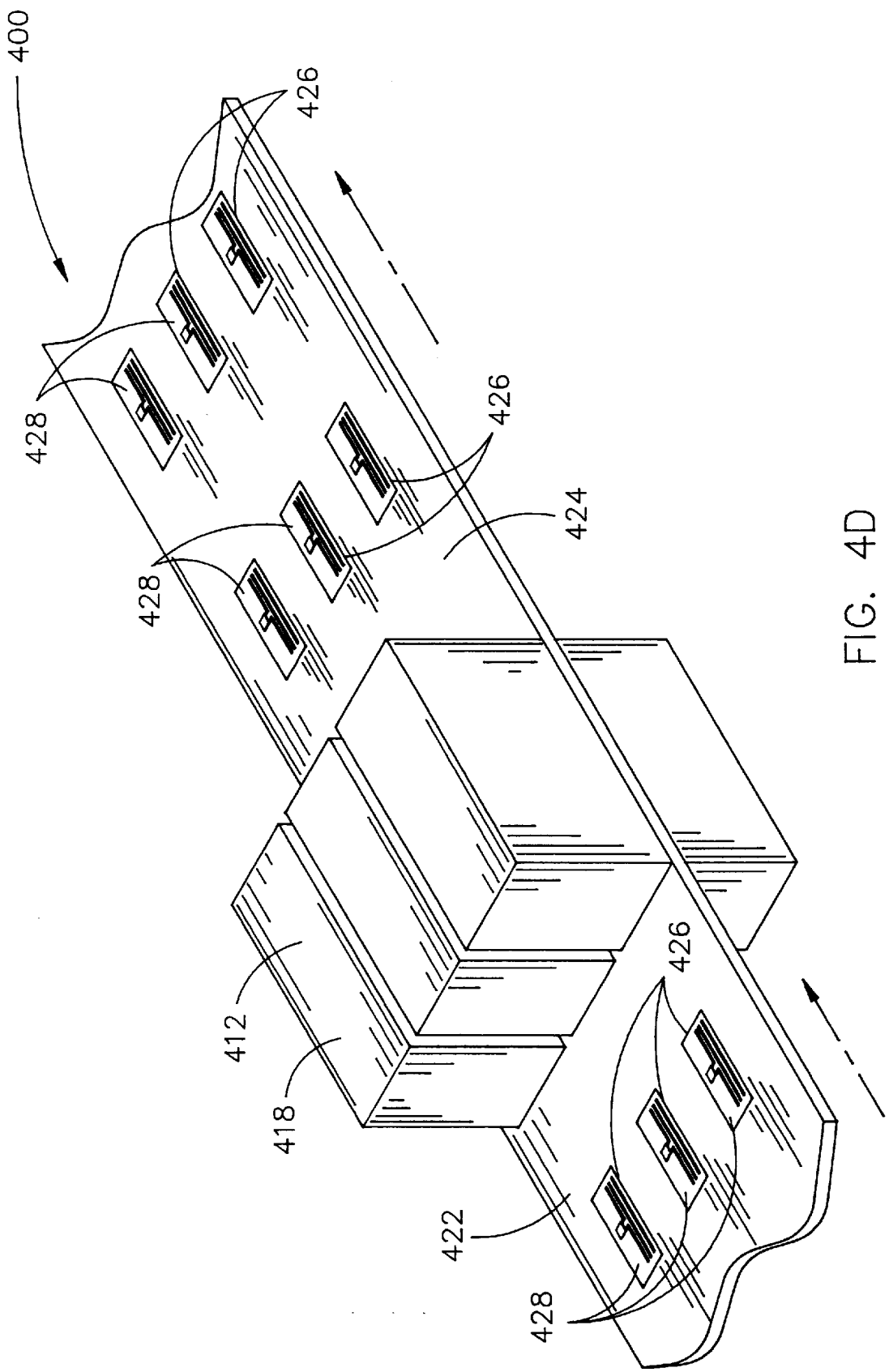
FIG. 4D is an isometric view of an apparatus for testing RFID tags in accordance with the second exemplary embodiment of the present invention wherein the testing apparatus includes a conveyor for simultaneously positioning multiple RFID tags within multiple test chambers.

As shown in FIG. 4D, the RFID testing apparatus 400 may include multiple chambers 418 (three are shown) so that a plurality of RFID tags 426 may be tested simultaneously. The carriage assembly 422 may include a corresponding number of holders 426 (e.g., multiple rows of three holders 426 are shown) so that an RFID tag 428 may be positioned within each chamber 418.

Figure 5A:
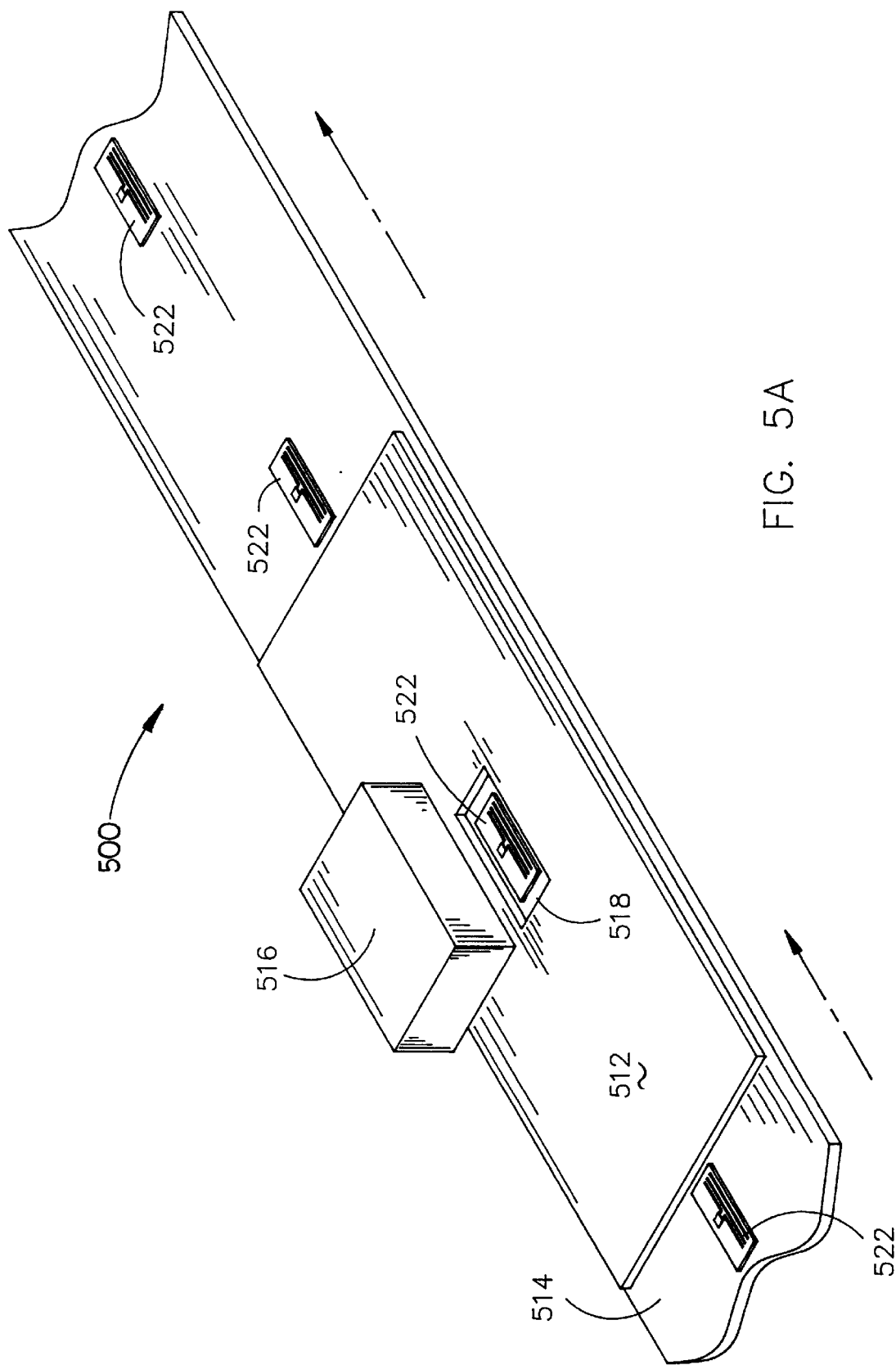
FIG. 5A is an isometric view of an apparatus for testing RFID tags in accordance with a third exemplary embodiment of the present invention wherein the testing apparatus includes an RF shield having an aperture formed therein for exposing an RFID tag to the RF interrogation field and a conveyor for sequentially positioning RFID tags within the aperture.
Figure 5B:
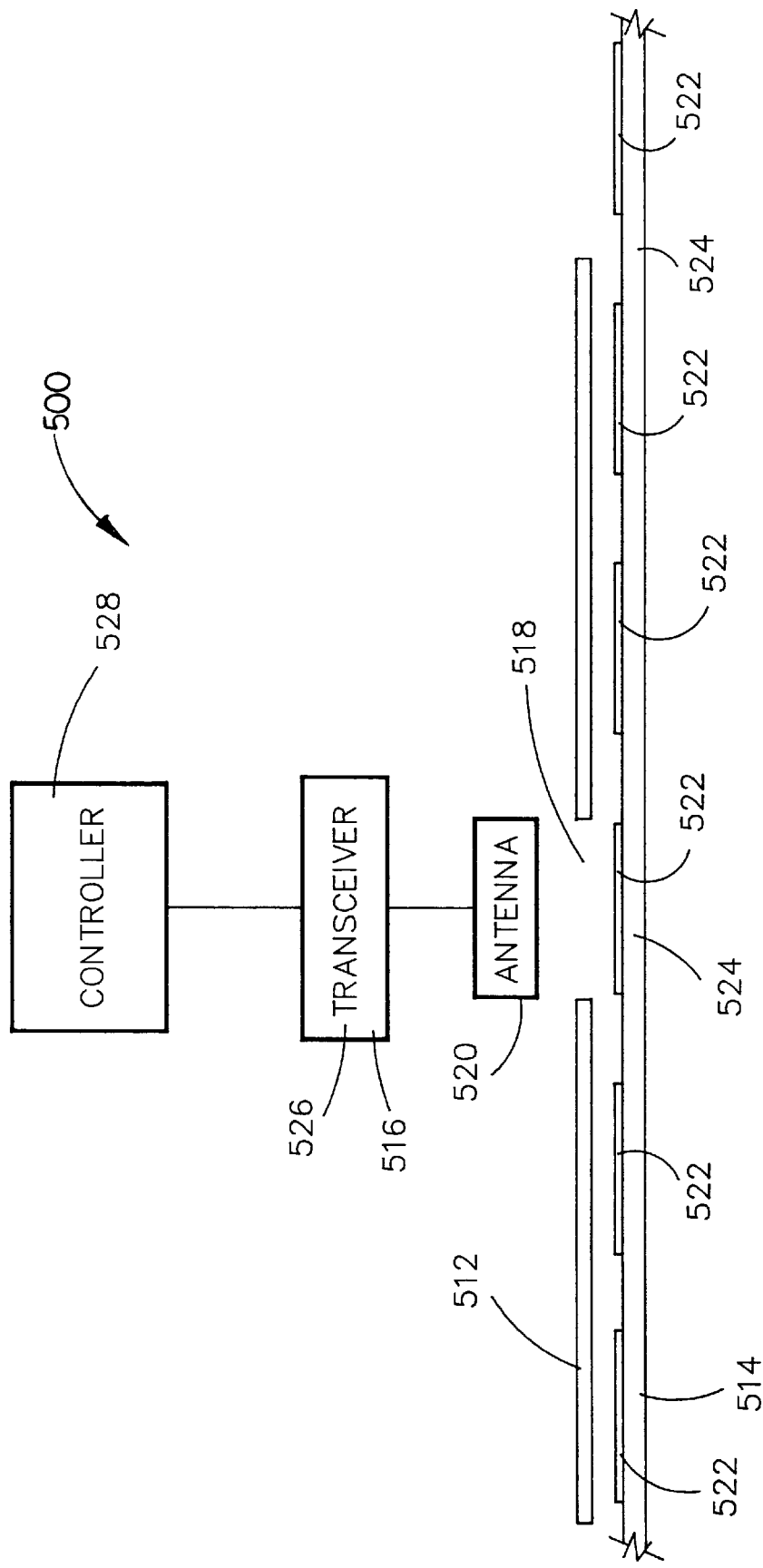
FIG. 5B is a diagrammatic cross-sectional side elevational view of the apparatus shown in FIG. 5A.

Referring now to FIGS. 5A and 5B, an apparatus for testing RFID tags in accordance with a third exemplary embodiment of the present invention is illustrated. The RFID tag testing apparatus 500 includes an RF shield 512 (FIG. 5B) comprising a generally flat plate substantially covering the carriage assembly 514. Preferably, the RF shield 512 comprises RF absorbing materials which reduce the RF emissions from the test assembly 516 in the area between the shield 512 and the carriage assembly 514 to a level where they are of insufficient intensity to activate RFID tags carried by the carriage assembly 514.

An aperture 518 is formed in the flat plate directly beneath the antenna 520 of the test assembly 516. Preferably, the aperture 518 is sized to expose one or more RFID tags 522 to the RF interrogation field generated by the test assembly 516. In this manner, the shield 512 may isolate all remaining RFID tags 522 which are in transit to be tested or which have already been tested from the RF interrogation field so that only the RFID tag or tags 522 positioned within the aperture 518 in the RF shield 512 are tested by the test assembly 516.

The carriage assembly 514 sequentially positions RFID tags 522 to be tested beneath the aperture 518 where they may be exposed to the RF interrogation field generated by the test assembly 516. The carriage assembly 514 preferably comprises a conveyor system (i.e., a conveyor belt, a slide, rollers, etc.) 524 on which assembled RFID tags 522 may be linearly arrayed once assembled. Preferably, the conveyor 524 moves as a constant rate so that each RFID tag 522 moves beneath the aperture 518 for a period of time sufficient for the test assembly 516 to test the tags functionality and to write any required information to the tag's memory. Alternatively, the conveyor system 524 may be indexed so that each RFID tag 522 is brought beneath the aperture 518 and held there momentarily while it is tested by the test assembly 516.

As shown in FIG. 5B, the test assembly 516 includes an RF antenna 520 and transceiver (or transmitter and receiver) 526 coupled to a controller 528. The controller 528 may control and integrate operation of the carriage assembly 514 and test assembly 516. Preferably, when an RFID tag 522 is moved into the aperture 518 by the carriage assembly 514, the controller 528 activates the transceiver 526 which generates and modulates the RF interrogation field. The RF interrogation field activates (e.g., powers and/or communicates with) the RFID tag 522 so that the various commands and functions of the RFID tag 522 may be tested and information such as programming, identification information, and the like may also be written to the tag 522. Preferably, the controller 528 compares the performance of RFID tag 522 with predetermined performance tolerances to determine if the RFID tag 528 is functioning properly. The controller 528 may also record the test results for later analysis.

Figure 6A:
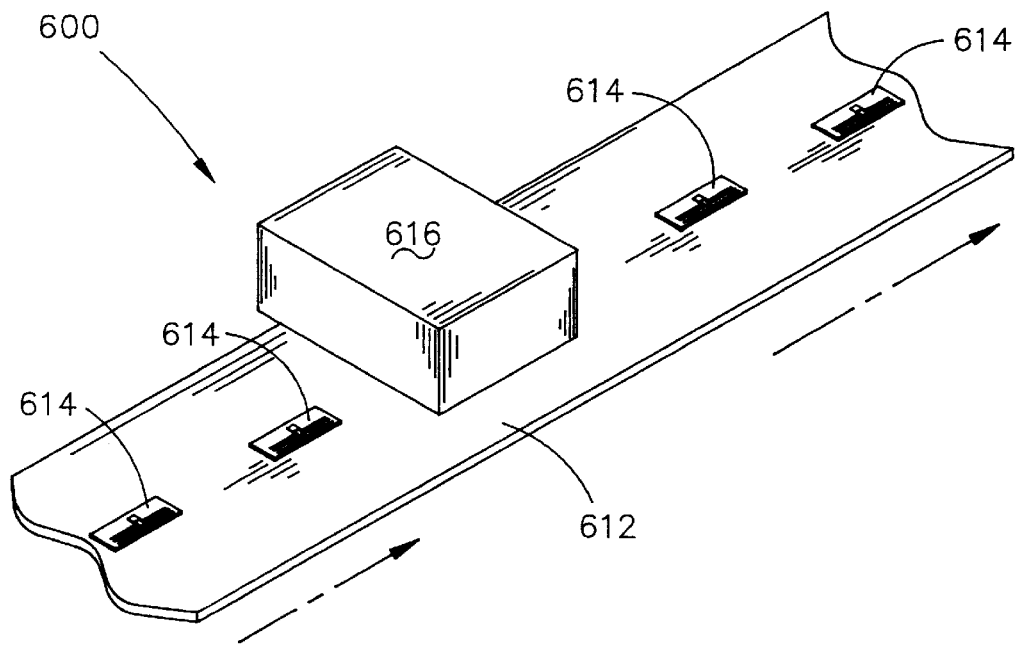
FIG. 6A is an isometric view of an apparatus for testing RFID tags in accordance with a fourth exemplary embodiment of the present invention using a low power RF field having a volume which is substantially the same as the volume of the RFID tag.
Figure 6B:
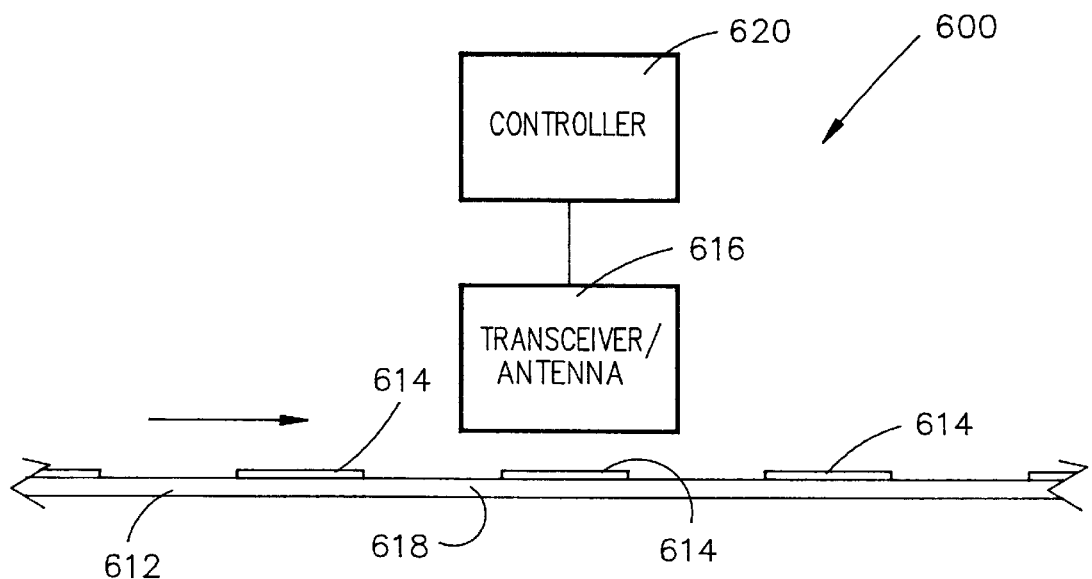
FIG. 6B is a diagrammatic cross-sectional view of the apparatus shown in FIG. 6A.

Referring now to FIGS. 6A and 6B, an apparatus for testing RFID tags in accordance with a fourth exemplary embodiment of the present invention is shown. The RFID testing apparatus 600 of this embodiment includes a carriage assembly 612 which sequentially positions RFID tags 614 to be tested within a low-power RF interrogation field generated by the test assembly 616. Preferably, the volume of the RF interrogation field (e.g., the volume in which the low-power RF field is strong enough to power the RFID tag 614) is substantially the same as the volume of the RFID tag 614. The RFID tag 614 being tested may be positioned within this field by the carriage assembly 612. RFID tags 614 may thus be placed in close proximity to the RFID tag 614 being tested while remaining unexposed and thus unaffected by the RF field. The carriage assembly 612 includes a conveyor system (i.e., a conveyor belt, a slide, rollers, etc.) 618 on which assembled RFID tags 614 may be arrayed in a linear fashion. Preferably, the conveyor 618 moves at a constant rate so that each RFID tag 614 is exposed to the RF interrogation field for a period of time sufficient for the test assembly 616 to test the tags functionality and to write any required information to the tag's memory. The conveyor system 618 may alternatively be indexed so that each RFID tag 614 is brought into the RF interrogation field and held there momentarily while it is tested by the test assembly 612.

As shown in FIG. 6B, the test assembly 616 includes an RF antenna and transceiver (or transmitter and receiver) coupled to a controller 620 which controls and integrates operation of the carriage assembly 612 and test assembly 616. Preferably, when an RFID tag 614 is moved within the RF interrogation field by the carriage assembly 612, the controller 620 activates the transceiver which generates and modulates the RF interrogation field. The RF interrogation field activates (e.g., powers and/or communicates with) the RFID tag 614 so that the various commands and functions of the RFID tag 614 may be tested and information such as programming, identification information, and the like may also be written to the tag 614. The controller 620 compares the performance of RFID tag 614 with predetermined performance tolerances to determine if the RFID tag 614 is functioning properly. The controller 620 may also record the test results for later analysis.

Figure 7:
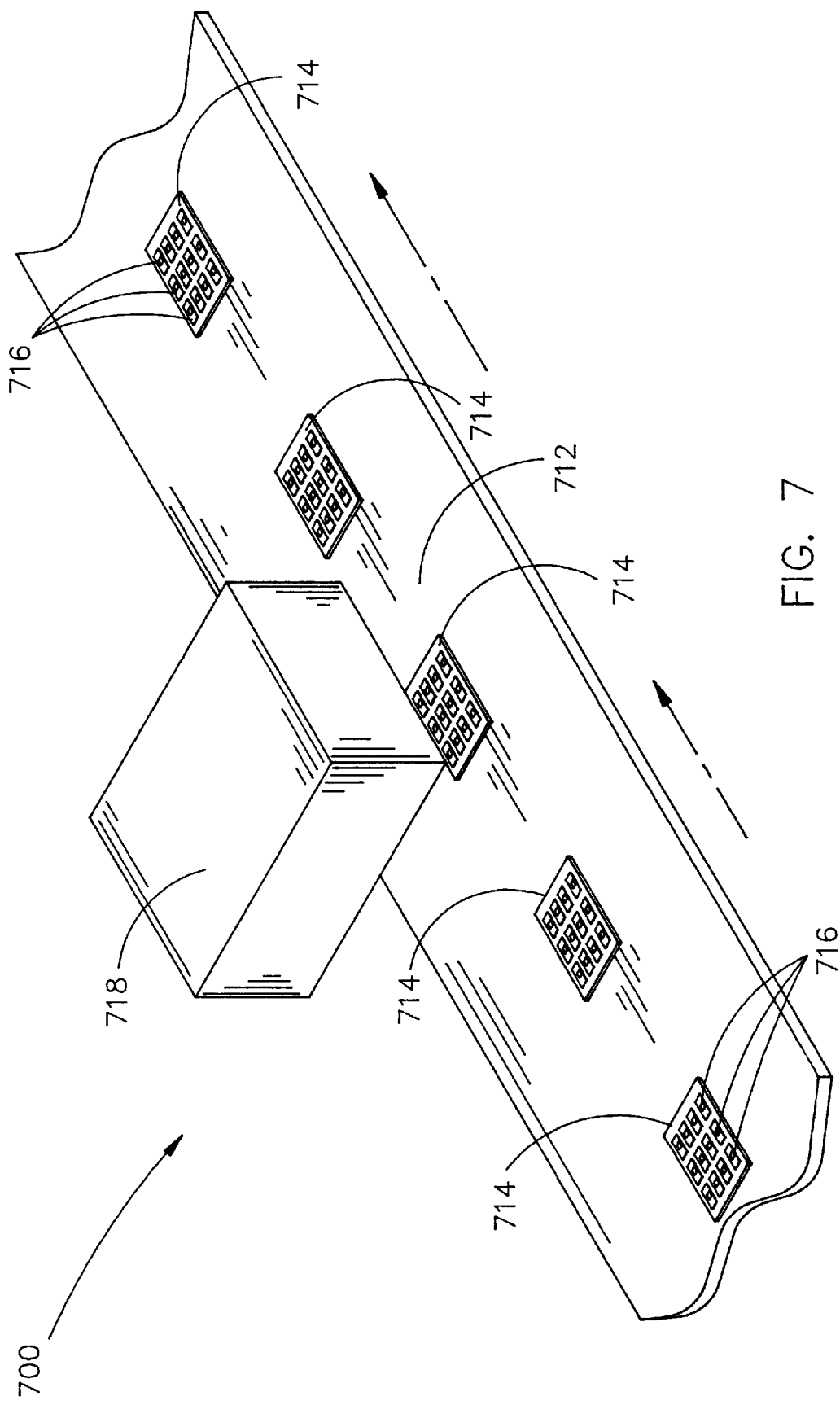
FIG. 7 is an isometric view of an apparatus for testing RFID tags in accordance with a fifth exemplary embodiment of the present invention wherein multiple RFID tags may be tested simultaneously.

Referring now to FIG. 7, an apparatus for testing RFID tags in accordance with a fifth exemplary embodiment of the present invention is shown. This RFID testing apparatus may be utilized to test RFID tags which support a multi-item identification protocol. The testing apparatus uses the multi-item identification protocol, rather than physical tag isolation or singulation, to effectively separate RFID tags for testing.

For example, as shown in FIG. 7, the testing apparatus 700 may include a carriage assembly 712 which sequentially positions a holder 714 containing a plurality of untested RFID tags 716 within an RF interrogation field generated by the test assembly 718. The carriage assembly 712 includes a conveyor system (i.e., a conveyor belt, a slide, rollers, etc.) on which assembled RFID tags 716 may be arrayed in groups (i.e., within holders 714). Preferably, the conveyor system moves at a constant rate so that each group of RFID tags 716 is exposed to the RF interrogation field for a period of time sufficient for the test assembly 718 to test each tag 716 within the group and to write any required information to the tag's memory. The conveyor system may alternatively be indexed so that each group of RFID tags 716 is brought into the RF interrogation field and held there momentarily while tags within the group are tested. Once a group of RFID tags 716 is positioned within the RF interrogation field, the testing apparatus 700 identifies each RFID tag 716 within the group (i.e., within the range of the RF interrogation field). This enables individual access of each RFID tag 716 so that all identified tags 716 within the group may then be sequentially tested.

Figure 8A:
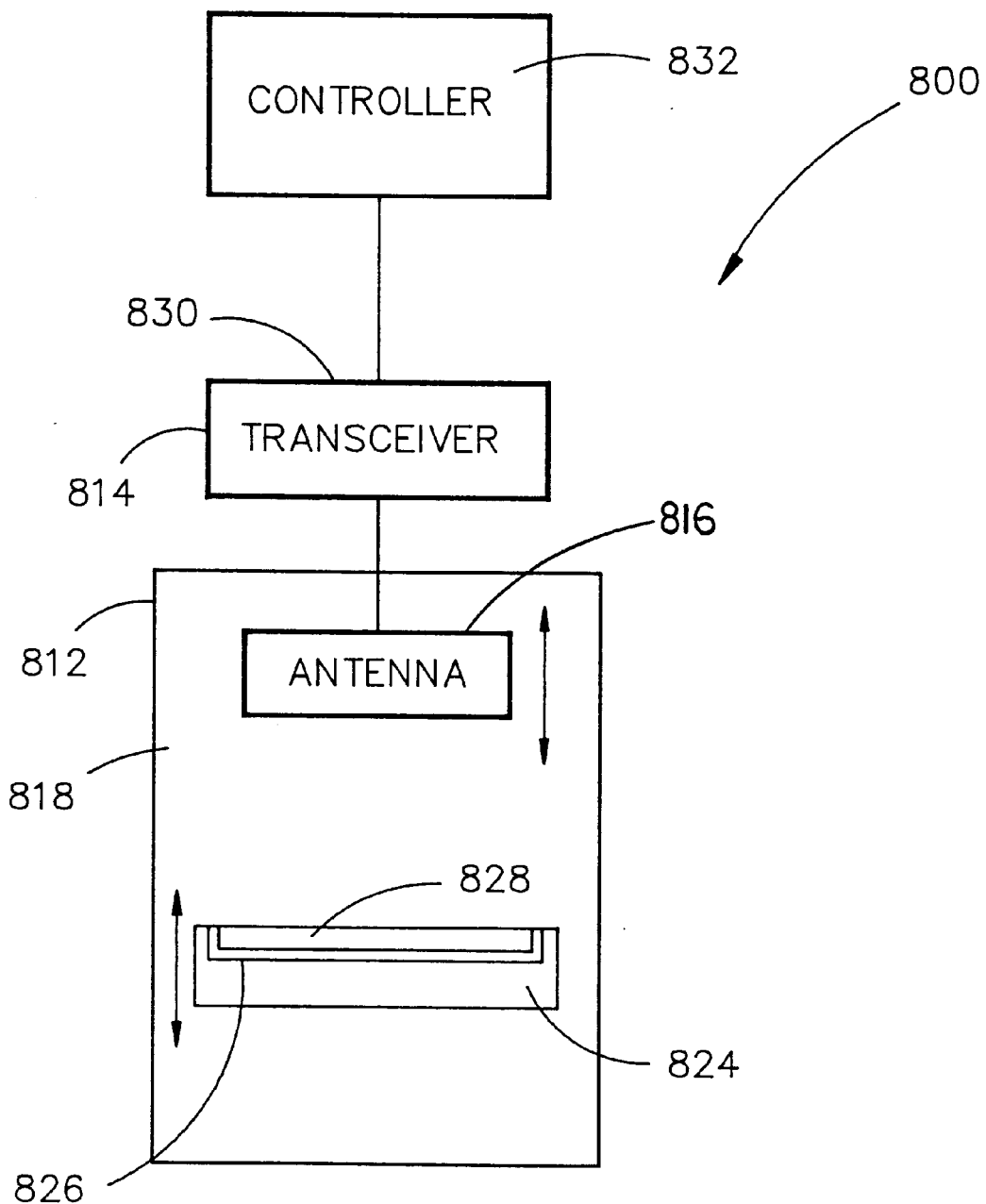
FIGS. 8A and 8B are block diagrams depicting use of the apparatus of the present invention for testing the operation distance of an RFID tag.
Figure 8B:
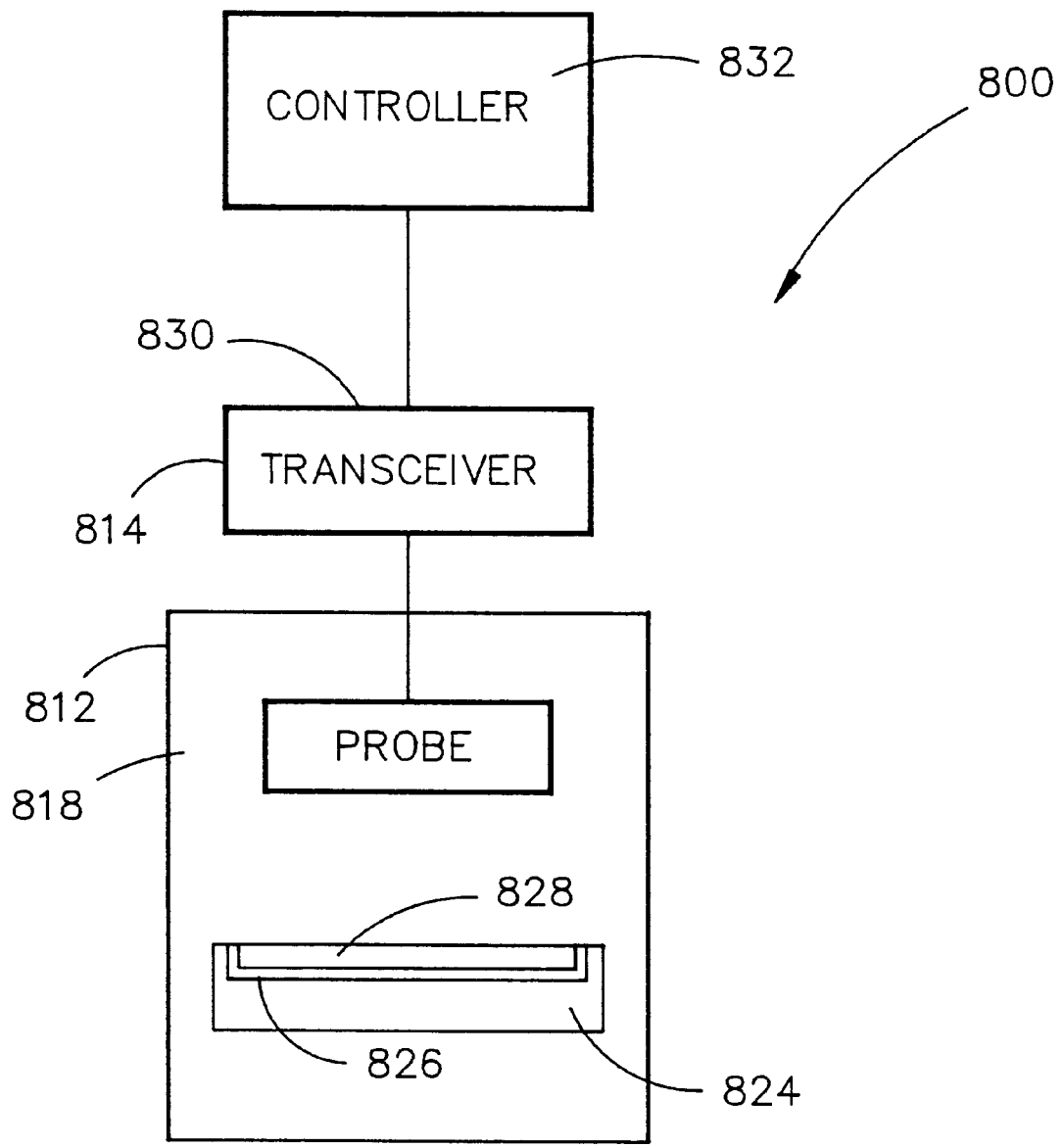

Turning now to FIGS. 8A and 8B, measurement of operation distance may be used to determine if an RFID tag is functioning properly (i.e., an improperly functioning RFID tag will often have a limited operation distance). As shown in FIGS. 8A and 8B, the RFID tag testing apparatus 800 in accordance with the present invention may include an RF shield 812 (i.e., a test chamber 818), a test assembly 814, and a carriage assembly 824. The carriage assembly 824 positions one or more RFID tags 828 to be tested within the test chamber 818 where they are exposed an RF interrogation field generated by the test assembly 814. The carriage assembly 824 preferably includes one or more shallow recesses in its upper surface forming holders 826 for removably receiving RFID tags 828.

The test chamber 818 may comprise a miniaturized anechoic chamber formed of or lined with RF absorbing material which creates an anechoic environment simulating a free space (FIG. 8A). The test assembly 814 includes an RF transceiver 830 and antenna 816 which generate the RF interrogation field within the test chamber 818. Alternatively, the chamber 818 may comprise a resonant cavity which is sized to have a resonant frequency which is the same as the RFID system's carrier frequency (FIG. 8B). The resonant cavity is excited by one or multiple probes (i.e., a hook or pin type probe) which couples RF power in the transmission line (e.g., coaxial cable) from the RF transceiver 830 to the field in the resonant cavity. See, R. E. Collin, *Foundations for Microwave Engineering*, 2nd Ed., McGraw Hill, 1992.

The transceiver 830 may be coupled to a controller, processor or the like 832. The controller 832 may control and integrate operation of the carriage assembly 824 and test assembly 814. The controller 832 may also record the test results for later analysis.

Referring to FIG. 8A, an RFID tag 828 may be positioned within the test chamber 818 by the carriage assembly 824. The transceiver 830 of the test assembly 814 may be operated at normal operation power for the RFID system with which the RFID tag 828 is to be used. The RFID tag 828 may be moved linearly with respect to the antenna 816 of the testing apparatus 814 until its operation distance is determined. Movement of the RFID tag 828 may be accomplished by moving the carriage assembly 824 away from (or, alternately, toward) the antenna 816 until the edge or limit of the readable zone of the RFID tag 828 is identified and the operation distance is determined.

Alternatively, it is known that operation distance of an RFID tag 828 is a function of parameters such as antenna gain, impedance matching factor, transmitted power, etc. Thus, the operation distance of an RFID tag 828 may be determined by varying one or a combination of these parameters and then calculating the operation distance using a known relationship between the parameter or parameters varied and the operation distance.

For example, operation distance is a function of antenna gain. Thus, operation distance may be determined by modifying the antenna gain of the testing assembly's antenna 816. Since antenna gain is itself a function of antenna direction, this may be accomplished by rotating the antenna 816 of the test assembly 814 with respect to the RFID tag 828. Similarly, antenna gain of the RFID tag's antenna may be changed by rotating the RFID tag 828 with respect to the test assembly antenna. This may be accomplished by rotating the RFID tag 828 within the carriage assembly 824 or by rotating the carriage assembly 824 itself.

Operation distance is also a function of transmitted power. Thus, the transmitted power of the testing apparatus transceiver 830 may be varied electronically. The controller 832 may be modified to vary the transmitted power of the test assembly 814.

Operation distance is further a function of the polarization matching factor between the antenna of the RFID tag 828 and the test assembly antenna. The polarization matching factor may be varied by mechanically changing the relative orientation of the RFID tag antenna and the test assembly antenna 816, or by electronically changing the axial ratio of the test assembly antenna 816. As shown in FIG. 8B, wherein the test chamber 818 comprises a resonant cavity, the polarization matching factor may also be varied by modifying the ratio of power sent through each of multiple probes coupled to the resonant cavity. The probes excite different cavity modes that have different field polarizations.

Referring now to FIG. 9, operation distance may also be determined by changing the input impedance of the RFID tag antenna. This may be accomplished by placing a metallic object in proximity to the RFID tag's antenna as a loading element. As shown in FIG. 9, the RFID tag testing apparatus 900 includes an RF shield 912 comprising a generally flat metal plate (or other metal object) 918 substantially covering the carriage assembly 914. The metal plate 918 modifies the input impedance of the RFID tag's antenna to change its impedance matching factor. In this manner, the metal plate 918 functions as a parasitic loading element which couples to the antenna of each shielded RFID tag 922 electromagnetically, thereby disabling all RFID tags 922 being tested (by deteriorating their impedance matching factor) except for the RFID tag or tags 922 under test (e.g., which are positioned within an aperture or opening in the metal plate 918 so as to be exposed to the RF interrogation field generated by the test assembly 916 without degradation of their impedance matching factor). A smaller metal object 924 may be brought positioned near the RFID tag 922 under test in steps to modify its impedance matching factor so that its operation distance may be determined.

It is believed that the method and apparatus for testing RFID tags of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An apparatus for testing RFID tags using wireless radio frequency communication, comprising:
   a test assembly generating a radio frequency field for communicating with an RFID tag when the RFID tag is positioned within the radio frequency field; and
   a carriage for sequentially positioning RFID tags within the radio frequency field generated by said test assembly.

2. The apparatus of claim 1, further comprising an RF shield for shielding RFID tags from the radio frequency field until they are positioned therein by said carriage.

3. The apparatus of claim 2, wherein said RF shield comprises a chamber enclosing said test assembly.

4. The apparatus of claim 3, wherein said carriage positions RFID tags within said chamber.

5. The apparatus of claim 4, wherein said carriage positions RFID tags within a region of exposure to the radio frequency field.

6. The apparatus of claim 3, wherein the chamber comprises an anechoic chamber.

7. The apparatus of claim 3, wherein said test assembly comprises a radio frequency transceiver for generating the radio frequency field and processing return signals from the RFID tag.

8. The apparatus of claim 7, wherein said test assembly further comprises an antenna disposed within said chamber and operatively coupled to said transceiver for propagating the RF field.

9. The apparatus of claim 8, wherein said antenna also receives return signals from the RFID tag.

10. The apparatus of claim 3, wherein said test assembly comprises a radio frequency transmitter and receiver for generating the radio frequency field and processing return signals from the RFID tag.

11. The apparatus of claim 10, wherein said test assembly further comprises an antenna disposed within said chamber and operatively coupled to said transceiver for propagating the RF field.

12. The apparatus of claim 11, wherein said antenna also receives return signals from the RFID tag.

13. The apparatus of claim 3, wherein the chamber comprises a resonant cavity.

14. The apparatus of claim 13, further comprising a probe for exciting the resonant cavity by coupling RF power to the field within the resonant cavity.

15. The apparatus of claim 3, wherein said carriage comprises a rotatable stage for transporting the RFID tag into said chamber so that the RFID tag is positioned within the radio frequency field generated by said test assembly.

16. The apparatus of claim 3, wherein said carriage comprises a conveyor for transporting the RFID tag into said chamber so that the RFID tag is positioned within the radio frequency field generated by said test assembly.

17. The apparatus of claim 2, wherein said RF shield is positioned between said carriage and said test assembly for shielding RFID tags carried by said carriage from the radio frequency field, said RF shield including an aperture for exposing an RFID tag to the radio frequency field when the RFID tag is positioned within the aperture by the carriage.

18. The apparatus of claim 17, wherein said carriage positions the RFID tag within a region of exposure to the radio frequency field.

19. The apparatus of claim 17, wherein said RF shield comprises radio frequency absorbing material.

20. The apparatus of claim 17, wherein said RF shield comprises a metal plate positioned to modify the input impedance of the RFID tags.

21. The apparatus of claim 17, wherein said test assembly comprises a radio frequency transceiver for generating the radio frequency field and processing return signals from the RFID tag.

22. The apparatus of claim 21, wherein said test assembly further comprises an antenna operatively coupled to said transceiver for propagating the RF field.

23. The apparatus of claim 22, wherein said antenna also receives return signals from the RFID tag.

24. The apparatus of claim 17, wherein said test assembly comprises a radio frequency transmitter and receiver for generating the radio frequency field and processing return signals from the RFID tag.

25. The apparatus of claim 24, wherein said test assembly further comprises an antenna operatively coupled to said transmitter and receiver for propagating the RF field.

26. The apparatus of claim 25, wherein said antenna also receives return signals from the RFID tag.

27. The apparatus of claim 17, wherein said carriage comprises a conveyor.

28. The apparatus of claim 1, wherein the volume of the RF field generated by the test assembly is substantially the same as the volume of the RFID tag, and wherein the RFID tag is positioned in proximity to the test assembly by the carriage.

29. The apparatus of claim 28, wherein said carriage positions the RFID tag within a region of exposure to the radio frequency field.

30. The apparatus of claim 28, wherein said test assembly comprises a transceiver for generating the radio frequency field and processing return signals from the RFID tag.

31. The apparatus of claim 30, wherein said test assembly comprises an antenna operatively coupled to said transceiver for propagating the radio frequency field.

32. The apparatus of claim 31, wherein said antenna also receives return signals from the RFID tag.

33. The apparatus of claim 28, wherein said carriage comprises a rotatable stage for positioning the RFID tag within the radio frequency field generated by said test assembly.

34. The apparatus of claim 28, wherein said carriage comprises a conveyor for positioning the RFID tag within the radio frequency field generated by said test assembly.

35. The apparatus of claim 1, further comprising a controller for controlling operation of the test assembly and carriage.

36. The apparatus of claim 1, further comprising a sorting apparatus for sorting tested RFID tags according to the performance of the RFID tag.

37. A method for testing RFID tags using wireless radio frequency communication, comprising the steps of:
   a) generating a radio frequency field for testing the RFID tags;
   b) sequentially positioning each RFID tag within the radio frequency field while substantially isolating the remaining RFID tags from the field;

b) communicating with each RFID tag while it is positioned within the radio frequency field; and c) removing each RFID tag from the radio frequency field.

38. The method according to claim 37, wherein the positioning step comprises shielding the remaining RFID tags from the RF field.

39. The method according to claim 38, wherein the positioning step comprises transporting each RFID tag to the inside of a miniaturized anechoic chamber.

40. The method according to claim 39, wherein the positioning step comprises placing the RFID tags within the chamber in the near-field region of the radio frequency field.

41. The method according to claim 39, wherein the positioning step comprises placing each RFID tag onto a rotatable stage and rotating the stage so that the RFID tag is transported into the chamber.

42. The method according to claim 39, wherein the positioning step comprises placing each RFID tag onto a conveyor wherein the conveyor transports the RFID tag into the chamber.

43. The method according to claim 38, wherein the positioning step comprises transporting each RFID tag to the inside of a resonant cavity.

44. The method according to claim 43, wherein the positioning step comprises placing each RFID tag onto a rotatable stage and rotating the stage so that the RFID tag is transported into the resonant cavity.

45. The method according to claim 43, wherein the positioning step comprises placing each RFID tag onto a conveyor wherein the conveyor transports the RFID tag into the resonant cavity.

46. The method according to claim 38, wherein the positioning step comprises transporting the RFID tags beneath an RF shield having an aperture formed therein, and exposing each RFID tag to the radio frequency field via the aperture.

47. The method according to claim 46, wherein the positioning step comprises placing the RFID tags within the chamber in the near-field region of the radio frequency field.

48. The method according to claim 46, wherein the positioning step comprises placing each RFID tag onto a conveyor wherein the conveyor transports beneath the RF shield.

49. The method according to claim 37, wherein the positioning step comprises transporting the RFID tags near a metal object so that the RFID tags impedance matching factor is changed.

50. The method according to claim 37, wherein the positioning step comprises locating the RFID tag in an RF field having a volume substantially the same as the volume of the RFID tag wherein the intensity of the RF field applied to the RFID tag located therein is substantially greater than the intensity of the RF field applied to the remaining RFID tags.

51. The method according to claim 50, wherein the positioning step comprises placing the RFID tags within the near-field region of the radio frequency field.

52. The method according to claim 50, wherein the positioning step comprises placing each RFID tag onto a rotatable stage and rotating the stage so that the RFID tag is positioned within the radio frequency field.

53. The method according to claim 52, wherein the positioning step comprises placing each RFID tag onto a conveyor wherein the conveyor transports the RFID tag into the RF field.

54. The method according to claim 37, wherein the communicating step comprises writing information to the RFID tag.

55. The method according to claim 37, wherein the communicating step comprises testing a command of the RFID tag.

56. The method according to claim 51, further comprising tabulating the results of the test and relating test parameters to the functional performance of the RFID tag.

57. The method according to claim 52, further comprising sorting each RFID tag according to its functional performance.

58. The method according to claim 37, wherein the communicating step includes determining the operation distance of the RFID tag.

* * * * *